US012645963B1

(12) United States Patent (10) Patent No.: US 12,645,963 B1
Niu et al. (45) Date of Patent: Jun. 2, 2026

(54) SYSTEMS AND METHODS TO LEARN TWO-LEVEL SYSTEM DEFECTS IN QUANTUM SYSTEMS

(71) Applicant: Google LLC, Mountain View, CA (US)

(72) Inventors: Yuezhen Niu, El Segundo, CA (US); Vadim Smelyanskiy, Mountain View, CA (US); Sergio Boixo Castrillo, Rancho Palos Verdes, CA (US); Paul Victor Klimov, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 1359 days.

(21) Appl. No.: 17/010,937

(22) Filed: Sep. 3, 2020

Related U.S. Application Data

(60) Provisional application No. 62/895,746, filed on Sep. 4, 2019.

(51) Int. Cl.
*G06N 10/20* (2022.01)
*G06F 18/214* (2023.01)
*G06N 3/08* (2023.01)
*H10N 60/80* (2023.01)

(52) U.S. Cl.
CPC ........... *G06N 10/20* (2022.01); *G06F 18/214* (2023.01); *G06N 3/08* (2013.01); *H10N 60/805* (2023.02)

(58) Field of Classification Search
CPC ........ G06N 10/20; G06N 3/08; G06F 18/214; H10N 60/805
See application file for complete search history.

(56) References Cited

U.S. PATENT DOCUMENTS 5,214,746 A * 5/1993 Fogel ..................... G06N 3/086
706/15
10,325,218 B1 * 6/2019 Zeng ..................... G06N 20/00

OTHER PUBLICATIONS

Cho, Hyun-Seob. "Robust control of Nonlinear System Using Multilayer Neural Network." The Journal of Korea Institute of Information, Electronics, and Communication Technology 6.4 (2013): 243-248. (Year: 2013).*
Müller, Clemens, Jared H. Cole, and Jürgen Lisenfeld. "Towards understanding two-level-systems in amorphous solids—Insights from quantum circuits." arXiv preprint arXiv:1705.01108v2, version 2 (2018). (Year: 2018).*
Niu, Murphy Yuezhen, et al. "Learning Non-Markovian Quantum Noise from Moir\'{e}-Enhanced Swap Spectroscopy with Deep Evolutionary Algorithm." arXiv preprint arXiv:1912.04368 (2019). (Year: 2019).*

(Continued)

*Primary Examiner* — Markus A. Vasquez
(74) *Attorney, Agent, or Firm* — DORITY & MANNING, P.A.

(57) ABSTRACT

Example aspects of the present disclosure provide systems and methods to learn machine-learned model parameters for models of quantum computing systems. In particular, example aspects of the present disclosure are directed to systems and methods to learn a deep neural network configured to predict parameter values for a physical model that models quantum dynamics of interactions between one or more qubits of a quantum gate and one or more two-level-system (TLS) defects during operation of the quantum gate through use of an evolutionary algorithm.

19 Claims, 12 Drawing Sheets

(56) References Cited

OTHER PUBLICATIONS

Banaszek et al, "Maximum-Likelihood Estimation of the Density Matrix", Physical Review A, vol. 61, 4 pages.

Cole et al, "Quantitative Evaluation of Defect-Models in Superconducting Phase Qubits", Applied Physics Letters, 4 pages.

Kelly et al, Coherent Josephson Qubit Suitable for Scalable Quantum Integrated Circuits, Physical Review Letters, Aug. 23, 2013, 5 pages.

Klimov et al, "Fluctuations of Energy-Relaxation Times in Superconducting Qubits", Physical Review Letters, 2018, 5 pages.

Leggett et al, "Tunneling Two-Level Systems: Model of the Low-Temperature Properties of Glasses: Are Smoking-Gun Tests Possible?", The Journal of Physical Chemistry, 6 pages.

Lisenfeld et al, "Observation of Directly Interacting Coherent Two-Level Systems in an Amorphous Material", Nature Communications, 6 pages.

Martinis et al, "Decoherence in Josephson Qubits from Dielectric Loss", Physical Review Letters, Nov. 18, 2005, 4 pages.

Shalibo et al, Lifetime and Coherence of Two-Level Defects in a Josephson Junction, Physical Review Letters, Oct. 22, 2010, 5 pages.

Toni et al, "Approximate Bayesian Computation Scheme for Parameter Inference and Model Selection in Dynamical Systems", Journal of the Royal Society Interface, 2009, pp. 187-202.

Yu, "Why Study Due to Two Level Systems: A Suggestion for Experimentalists", Journal of Low Temperature Physics, vol. 137, Nov. 2004, pp. 251-265.

* cited by examiner

Figure 6:
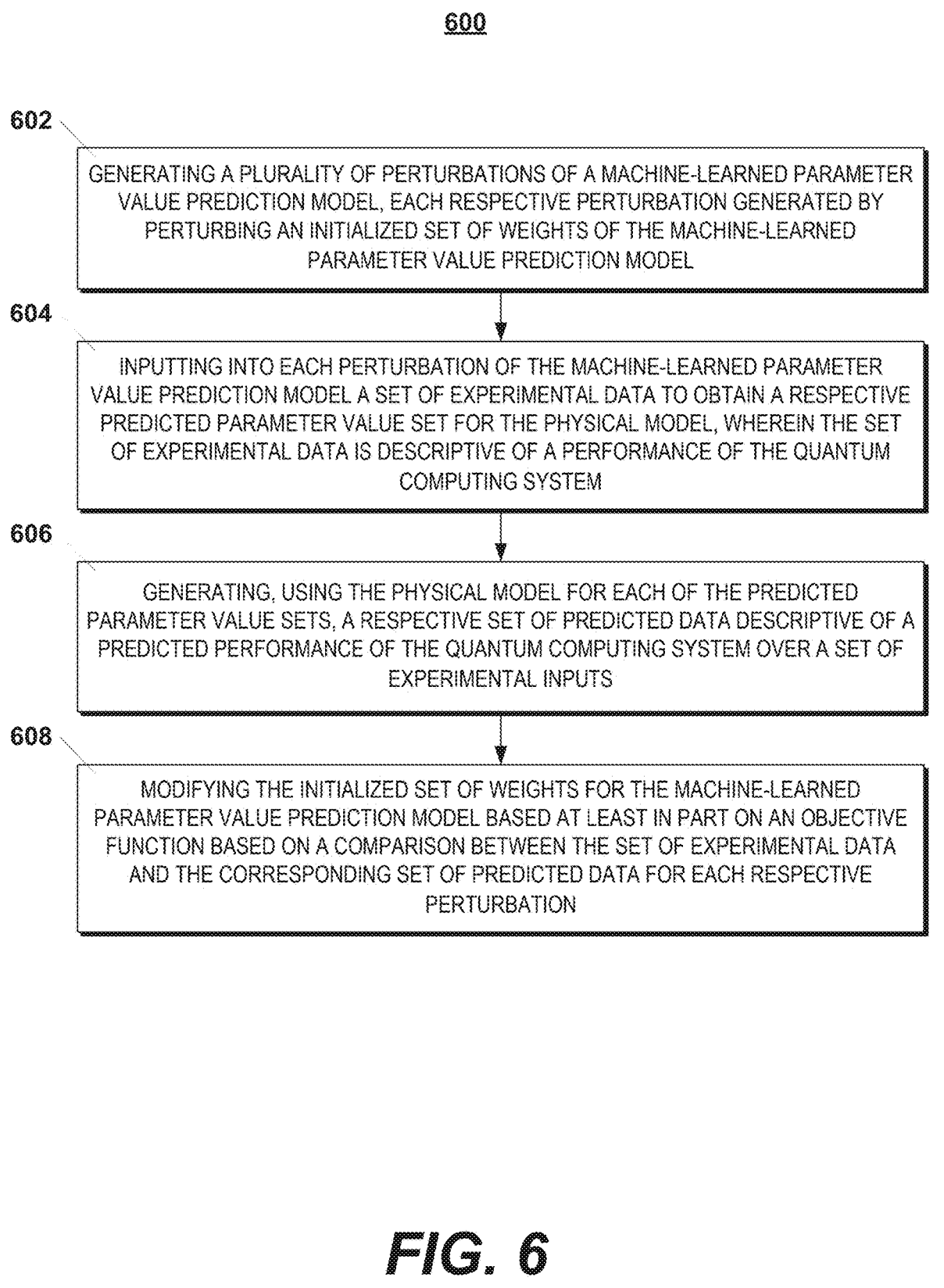

600

602

GENERATING A PLURALITY OF PERTURBATIONS OF A MACHINE-LEARNED PARAMETER VALUE PREDICTION MODEL, EACH RESPECTIVE PERTURBATION GENERATED BY PERTURBING AN INITIALIZED SET OF WEIGHTS OF THE MACHINE-LEARNED PARAMETER VALUE PREDICTION MODEL

604

INPUTTING INTO EACH PERTURBATION OF THE MACHINE-LEARNED PARAMETER VALUE PREDICTION MODEL A SET OF EXPERIMENTAL DATA TO OBTAIN A RESPECTIVE PREDICTED PARAMETER VALUE SET FOR THE PHYSICAL MODEL, WHEREIN THE SET OF EXPERIMENTAL DATA IS DESCRIPTIVE OF A PERFORMANCE OF THE QUANTUM COMPUTING SYSTEM

606

GENERATING, USING THE PHYSICAL MODEL FOR EACH OF THE PREDICTED PARAMETER VALUE SETS, A RESPECTIVE SET OF PREDICTED DATA DESCRIPTIVE OF A PREDICTED PERFORMANCE OF THE QUANTUM COMPUTING SYSTEM OVER A SET OF EXPERIMENTAL INPUTS

608

MODIFYING THE INITIALIZED SET OF WEIGHTS FOR THE MACHINE-LEARNED PARAMETER VALUE PREDICTION MODEL BASED AT LEAST IN PART ON AN OBJECTIVE FUNCTION BASED ON A COMPARISON BETWEEN THE SET OF EXPERIMENTAL DATA AND THE CORRESPONDING SET OF PREDICTED DATA FOR EACH RESPECTIVE PERTURBATION

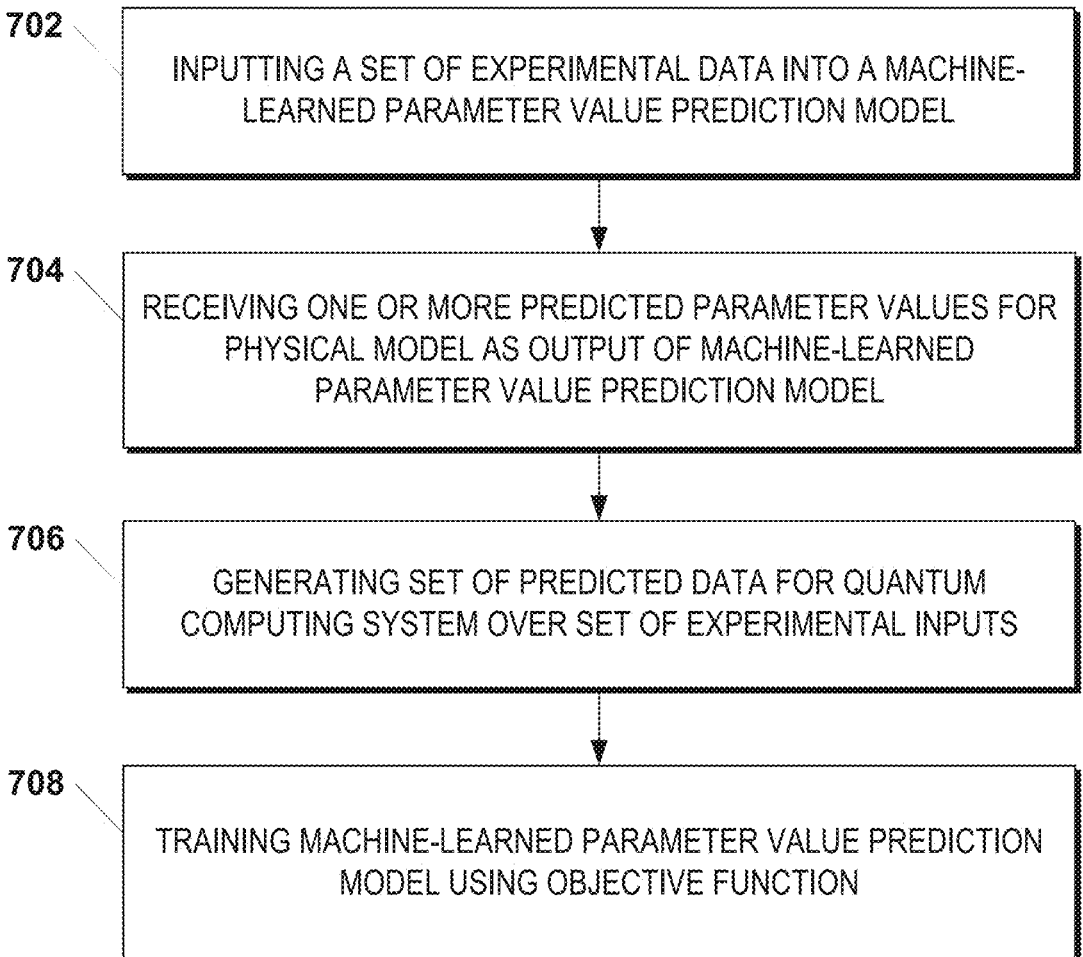

702 — INPUTTING A SET OF EXPERIMENTAL DATA INTO A MACHINE-LEARNED PARAMETER VALUE PREDICTION MODEL

704 — RECEIVING ONE OR MORE PREDICTED PARAMETER VALUES FOR PHYSICAL MODEL AS OUTPUT OF MACHINE-LEARNED PARAMETER VALUE PREDICTION MODEL

706 — GENERATING SET OF PREDICTED DATA FOR QUANTUM COMPUTING SYSTEM OVER SET OF EXPERIMENTAL INPUTS

708 — TRAINING MACHINE-LEARNED PARAMETER VALUE PREDICTION MODEL USING OBJECTIVE FUNCTION

*FIG. 7*

SYSTEMS AND METHODS TO LEARN TWO-LEVEL SYSTEM DEFECTS IN QUANTUM SYSTEMS

RELATED APPLICATIONS

This application claims priority to and the benefit of U.S. Provisional Patent Application No. 62/895,746, filed Sep. 4, 2019. U.S. Provisional Patent Application No. 62/895,746 is hereby incorporated by reference in its entirety.

FIELD

The present disclosure relates generally to learning model parameters for models of quantum computing systems.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as $a|0>+b|1>$. The "0" and "1" states of a digital computer are analogous to the $|0>$ and $|1>$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a computer-implemented method for training a machine-learned parameter value prediction model configured to predict parameter values for parameters of a physical model of a quantum computing system. The method includes obtaining, by a computing system comprising one or more classical processors, a set of experimental data descriptive of a performance of the quantum computing system; The method includes: obtaining, by a computing system comprising one or more classical processors, a set of experimental data descriptive of a performance of the quantum computing system; obtaining, by the computing system, an output of the physical model based at least in part on a set of experimental inputs; determining, by the computing system, a comparison of the output of the physical model to the data descriptive of the performance of the quantum computing system; and training, by the computing system, one or more parameters of the machine-learned parameter value prediction model using an evolutionary algorithm based at least in part on the comparison.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which:

FIG. 6 depicts an example method for training a machine-learned parameter value prediction model according to example embodiments of the present disclosure;

FIG. 7 depicts an example method for training a machine-learned parameter value prediction model according to example embodiments of the present disclosure;

DETAILED DESCRIPTION

Overview

Figure 1:
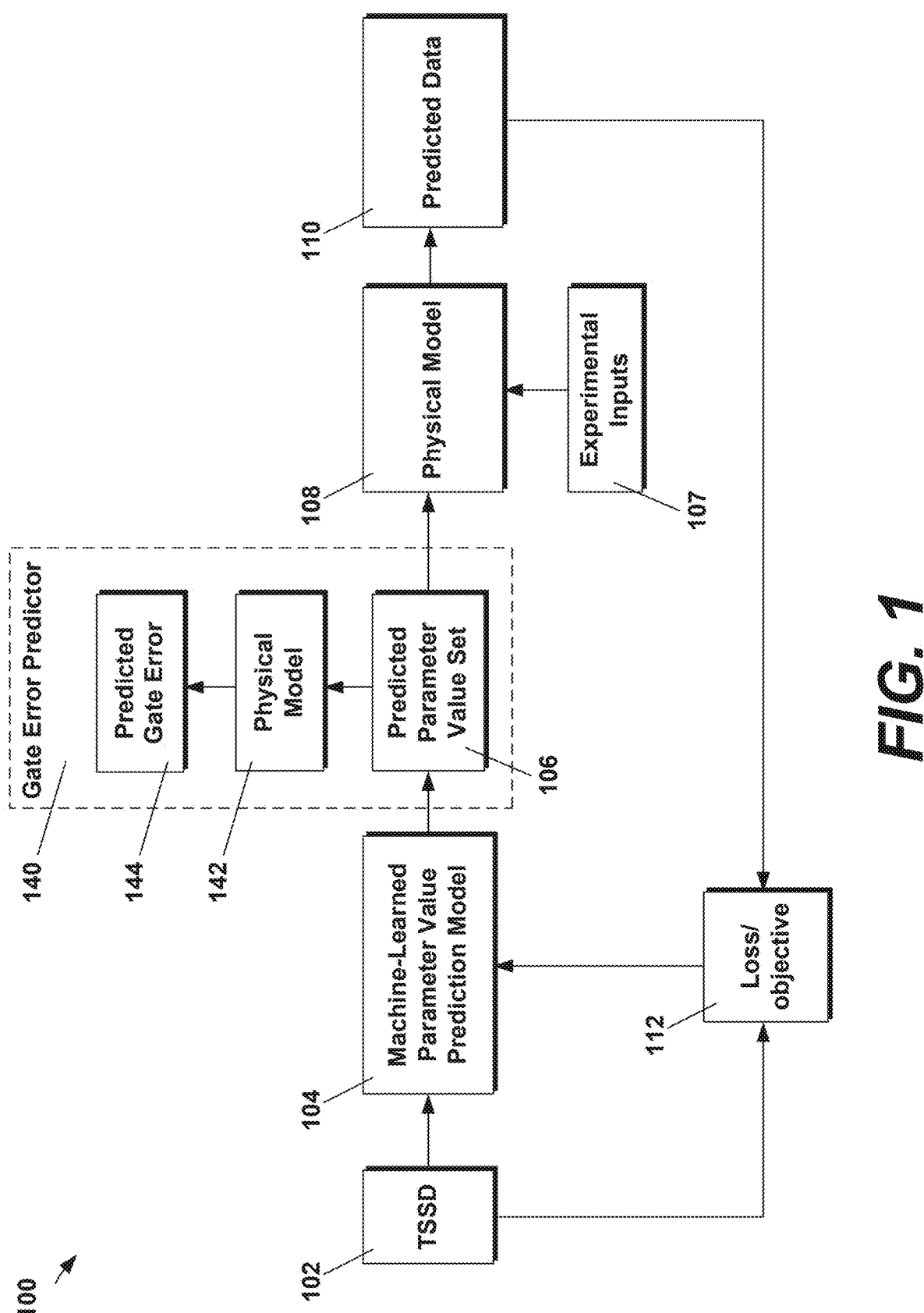
FIG. 1 depicts an overview of an example flow diagram according to example embodiments of the present disclosure.

Example aspects of the present disclosure are directed to systems and methods for learning machine-learned model parameters for models of quantum computing systems. In particular, aspects of the present disclosure are directed to systems and methods to learn a deep neural network configured to predict parameter values for a physical model that models the non-Markovian quantum dynamics of interactions between one or more qubits of a quantum gate and one or more two-level-system (TLS) defects during operation of the quantum gate through use of an evolutionary algorithm. In some embodiments, the predicted parameter values can be used to model gate errors for qubit gates.

Two-level-system (TLS) defects in amorphous dielectrics are a major source of noise and decoherence for superconducting qubits. Substantial progress has been made towards understanding the microscopic origin and behavior of TLS defects through the use of the superconducting qubit as a probe. In particular, the physical properties of TLS defects manifest in their interaction dynamics with qubits. Specifically, such interactions can be observed and measured when the qubit frequency is close to the frequency of the TLS. As such, swap spectroscopy is a commonly used experimental procedure to calibrate or evaluate TLS parameters. In particular, in swap spectroscopy, a qubit is prepared in the excited state and its frequency is changed to a range of values for different durations, during which the qubit might interact with a TLS defect of nearby frequency and location. Observing changes in the behavior of the qubit (e.g., unexpected state shifts) during the swap spectroscopy process can reveal information about the TLS defect with which it interacted (e.g., a frequency of the TLS defect).

In certain frequency-tunable qubits, multi-qubit quantum gates can be implemented by modulating the qubit's frequency and are thus susceptible to TLS-induced gate errors. Despite the above-described use of swap spectroscopy to understand device physics in regard to TLS distributions, it can be difficult to infer a gate fidelity of the quantum gate from swap spectroscopy data. Consequently, it can be beneficial to have noisy quantum channel descriptions for quantum circuits under the influence of TLS defects, which can be useful for developing fast error characterization (e.g., in real time). Given that the physical properties of TLS defects can change swiftly (e.g., over hours), the inability to perform fast error characterization can also reduce ability to perform corresponding error mitigation schemes (e.g., in real time) that account for such changes in the TLS defects.

According to example aspects of the present disclosure, a computer-implemented method can be implemented to train a machine-learned parameter value prediction model to predict parameter values for parameters of a physical model of a quantum system. For example, a computing system can obtain a set of experimental data associated with a quantum computing system. The experimental data can be descriptive of a performance of the quantum computing system. For example, in some implementations, the experimental data can include two-dimensional swap spectroscopy data (TSSD).

Referring to FIG. 1, an overview of an example flow diagram 100 for training a machine-learned parameter value prediction model according to example aspects of the present disclosure is depicted. As shown, a set of experimental data 102 (e.g., TSSD 102) can be input into a machine-learned parameter value prediction model 104. The TSSD 102 can be descriptive of a performance of the quantum computing system. The machine-learned parameter value prediction model 104 can generate a set of predicted parameter values 106 for input into a physical model 108. The physical model 108 can use the set of predicted parameter values 106 along with a set of experimental inputs 107 (e.g., optionally corresponding to the inputs used to obtain the experimental data 102) to generate a set of predicted data 110. The set of predicted data 110 can be descriptive of a predicted performance of the quantum computing system.

For example, the predicted data can correspond to a predicted TSSD measurement. The machine-learned parameter value prediction model 104 can then be trained based at least in part on a loss 112 determined based at least in part on a comparison between the TSSD 102 and the set of predicted data 110.

In some embodiments, the set of predicted parameter values can be used as part of a gate error prediction subsystem 140. For example, the set of predicted parameter values 106 can be additionally input into a physical model 142 for generating a predicted gate error 144 (e.g., optionally after the machine-learned parameter value prediction model 104 has been trained).

The physical model 142 can be the same as or different than the physical model 108. For instance, in some embodiments, the physical model 142 can be characterized by different features than the physical model 108. For instance, in one embodiment, the physical model 108 can include a physical experiment model which models the behavior of an experiment system (e.g., an experiment system for producing swap spectroscopy data, such as TSSD). In some embodiments, the physical model 108 is a model specially developed to describe the behavior of the experiment system, leveraging model assumptions to achieve sufficient accuracy to predict the behavior in the desired experiment context while reducing model complexity by tailoring the model assumptions to suit the experimental context. In some embodiments, the physical model 142 can be a more complex model than the physical model 108. For instance, in comparison to the physical model 108, the physical model 142 can comprise more terms and/or make fewer implicit assumptions about the behavior of the quantum dynamics of one or more qubits acted on by a gate. In this manner, for example, more processing budget can be allocated for processing of the physical model 142. In some embodiments, the physical model 108 and the physical model 142 comprise the same model and/or rely on the same model assumptions.

Advantageously, systems and methods according to example aspects of the present disclosure can use experimental data (e.g., swap spectroscopy data, such as TSSD) to elucidate underlying incoherent and coherent errors of a quantum gate. This data may additionally be useful when the frequency control for frequency-tunable qubits bears similarity to the form of a smoothed trapezoid, as some embodiments of TSSD measurement systems employ the same or similar frequency control trajectories, although the systems and methods disclosed herein may be used for a variety of frequency-tunable qubits.

The systems and methods according to example aspects of the present disclosure overcome many obstacles to learning physical parameters and/or models from experimental data. For instance, prior experimental methods can result in unwieldy datasets, as the quantum dynamics of TLS-qubit interactions can occur over disparate time scales: the exponential decay of qubit population due to incoherent coupling with TLSs and a bosonic environment can have, in some examples, a time scale greater than about 10 μs. On the other hand, the coherent effect of qubit-TLS interaction can manifest in a time scale of about 10 ns to about 100 ns (e.g., time scales associated with the inverse of the frequency gap between qubit and TLS and the coupling strength). Describing and/or predicting phenomena occurring over both time scales can involve data represented at intervals of about 5 ns or less, in some embodiments, which can produce large datasets that are computationally expensive to manipulate, especially if real-time processing is desired (e.g., for in-situ quantum control optimization over environmental and control defects).

Systems and methods according to example aspects of the present disclosure overcome these and other challenges by using a machine-learned parameter value prediction model to accurately and efficiently predict model parameters from lesser amounts of experimental data, lessening the computational demand for, e.g., real-time processing. Additionally, some embodiments of the present disclosure also decrease the amount of experimental data required by careful and systematic selection of experimental inputs to amplify spectral features. For instance, in some implementations, the set of experimental data can be obtained by collecting TSSD with non-uniform temporal sampling to amplify the temporal periodicity of non-Markovian oscillation patterns (e.g., similar to the Moiré effect). This can advantageously reduce the amount of experimental data used to train the machine-learned parameter value prediction model.

More particularly, systems and methods according to example aspects of the present disclosure can use TSSD for noisy quantum channel characterization (e.g., noise from TLS defects) by constructing a physical model of TLS-qubit dynamics. The physical model described herein can encompass a number of different cases. In some implementations, the physical model can encompass a first case in which the one or more TLS defects and the one or more qubits are weakly coupled such that a Born approximation and a second order linear perturbation theory apply and a coupling between the one or more TLS defects and the one or more qubits is Markovian. For example, a physical model can be derived in relation to this first case via stationary phase approximation.

As another example, additionally or alternatively to the first case, the physical model can encompass a second case in which the one or more TLS defects and the one or more qubits are strongly coupled such that a joint system of the defects and qubits is approximately coherent during operation of the quantum gate. For example, a physical model derived in relation to this second case can model qubit decay via a Landau-Zener transition and/or via coherent population oscillations between the one or more qubits and the one or more TLS defects.

The physical model, in one embodiment, can be based on a Hamiltonian of the joint-TLS-qubit-bath system, expressed as in Equation 1, $$\hat{H}(t) = \hat{H}_{TLS}(t) + \hat{H}_q(t) + \hat{H}_{q-TLS}(t) \tag{1}$$

where:

$\hat{H}_{TLS}(T)$ represents the TLS's free Hamiltonian, its coupling to an environment (e.g., bosonic bath), and the environmental Hamiltonian;

$\hat{H}_q(T)$ includes the Hamiltonian corresponding to the qubit's coupling to environmental defects, as well as the time-dependent control Hamiltonian $\hat{H}_{q,0}(t)$, given by $$\hat{H}_{q,0}(t) = -\frac{1}{2}\hbar\epsilon(t)\sigma_q^z, \tag{2}$$

where $\sigma_i^k$ denotes the Pauli k operator of system i; and $\hat{H}_{TLS-q}(t)$ represents transversal charge-charge coupling between the qubit and TLS, expressed as $$\hat{H}_{TLS-q}(t) = \lambda\sigma_{TLS}^x\sigma_q^x, \tag{3}$$

6 where:

$\lambda$ is the TLS-qubit coupling strength.

During a swap spectroscopy measurement (e.g., for obtaining TSSD), a qubit can evolve as described by the time-dependent control Hamiltonian $\hat{H}_{q,0}(t)$. The shape of the frequency modulation $\in(t)$ can resemble a smoothed trapezoid—for example, a first ramp from an initial frequency (e.g., an idle frequency $f_{idle}$) to a plateau frequency $f_{pl}$ over a ramp time $t_r$, where the plateau is held for a hold time $t_p$ before ramping down again over the ramp time $t_r$—the trapezoidal control trajectory having a total duration $$t_{tot} = t_p + 2t_r \tag{4}$$

where:

$t_p$ is the time duration at the plateau frequency (e.g., the "hold time"); and $t_r$ is the ramp time for changing the frequency from $f_{idle}$ to $f_{pl}$, and in some embodiments, returning the frequency from $f_{pl}$ to $f_{idle}$;

$f_{idle}$ is the initial/idle frequency of the qubit; and $f_{pl}$ is the plateau frequency during the modulation.

The corresponding unitary transformation can be labelled $U_{swap}$, such that the TSSD probabilities of a qubit decaying to its ground state from an initial excited state after the application of $U_{swap}$ for a range of $f_{pl}$ and $t_p$, where $t_r$ can be fixed (e.g., determined by the frequency bandwidth of the control electronics, or otherwise selected). For instance, TSSD can measure the qubit relaxation induced by the transversal charge-charge coupling between the qubit and TLS.

The probability of a qubit decaying to its ground state, as measured by TSSD, for example, can be predicted by the physical model in one embodiment according to Equation 5, $$P_{decay}(t_p, f_{pl}, \vec{p}_{TLS}) = \frac{\lambda^2 t_p^2}{\hbar^2}\text{Re}\left[\int_0^1 dx\right.$$
$$\left.\int_0^1 dy\, \exp(-t_p\Gamma_2|x-y|)\times\exp\left(t_{tot}\left((x-y)(f_{idle}-\omega_{TLS})+\epsilon_m\int_y^x\mu(z)dz\right)\right)\right] \tag{5}$$

where:

the set of physical parameters is defined $$\vec{p}_{TLS}=\{\Gamma_2,t_r,\lambda,\omega_{TLS}\}; \tag{6}$$

$\omega^{TLS}$ is the TLS frequency;

$\Gamma^2$ is a dephasing parameter which includes the known qubit dephasing rate from the environment, $\Gamma_{2,q}$, and the TLS dephasing rate, $\Gamma_{TLS,\phi}$;

$\in_m$ is a maximum frequency gap, expressed $\in_m=f_{pl}-f_{idle}$;

$\mu(z)$ is a unitless frequency modulation function that satisfies Equation 7;

$$\phi(\tau) = f_{idle}\tau + \int_0^\tau \epsilon(t)dt = f_{idle}\tau - \epsilon_m\int_0^\tau \mu(t)dt; \text{ and} \tag{7}$$

x and y are nondimensional time parameters normalized by the total overall runtime $t_{tot}$.

In this manner, for example, the machine-learned parameter value prediction model can be configured to predict the set of physical parameters $\{\Gamma_2, t_r, \omega, \omega_{TLS}\}$ which cause the model predictions for $P_{decay}$ to correspond to measured values for the decay probabilities (e.g., TSSD) over a set of experimental inputs $\{t_p, f_{pl}\}$. Thus, the machine-learned parameter value prediction model can advantageously be trained to extract the set of physical parameters from experimental data.

In some embodiments, the physical model may be approximated using a closed form representation for rapid processing by employing a stationary phase approximation. For example, rapid processing of the physical model can increase the speed and decrease the computational cost of evaluating a set of physical parameters generated by the machine-learned parameter value prediction model.

One embodiment of a closed form expression may be expressed in terms of a nondimensional dephasing parameter $$\gamma = t_r \tilde{\Gamma}_2, \tag{8}$$

a nondimensional qubit-TLS coupling $$\tilde{\lambda} = \frac{\lambda t_r}{\hbar}, \tag{9}$$

a nondimensional initial frequency gap $$\epsilon = t_r(f_{idle} - \omega_{TLS}), \tag{10}$$

a nondimensional maximum frequency gap $$\eta = t_r \epsilon_m, \tag{11}$$

a nondimensional phase $$\Phi(x) = \int_0^x \tilde{\mu}(\tau)d\tau, \tag{12}$$

and a nondimensional total runtime $$T = \frac{t_p}{t_r}, \tag{13}$$

where x and y are nondimensional time values (scaled by $t_r$) which satisfy the following relations of the dynamical phase:

$$F(x, y) = \epsilon(x - y) - \eta(\Phi(x) - \Phi(y)); \tag{14}$$

$$\Phi(0) = 0, \quad \Phi(T - 1) = \Phi(T) - \Phi(1); \text{ and} \tag{15}$$

$$\frac{\epsilon_q(t)}{\epsilon_m} = -\tilde{\mu}\left(\frac{t}{t_r}\right), \quad \tilde{\mu}(0) = \tilde{\mu}(T) = 0, \quad \tilde{\mu}(1) = \tilde{\mu}(T - 1). \tag{16}$$

Using the above nondimensionalized parameters, the probability of decay can be approximated by the following example closed-form representation shown in Equation 17.

$$P_{decay} = \left(\frac{\lambda t_r}{\hbar}\right)^2 \sum_{\alpha,\beta=1}^{3} R_{\alpha,\beta} \tag{17}$$

with:

-continued $$R_{22} = \tag{18}$$
$$(\gamma^2 + (\epsilon - \eta)^2)^{-2}[2(-\gamma^2 + \gamma(T - 2)(\gamma^2 + (\epsilon - \eta)^2) + e^{\gamma(2-T)}(\gamma^2 - (\epsilon - \eta)^2)$$
$$\cos((T - 2)(\epsilon - \eta)) + 2\gamma(\eta - \epsilon)\sin((T - 2)(\epsilon - \eta) + (\epsilon - \eta)^2)];$$

$$R_{11} = R_{33} = \frac{2\pi}{\eta|f'(x_c)|}|\text{erf}(z_1, z_2)|^2; \tag{19}$$

$$R_{13} = R_{31} = \pi \exp(-\gamma|T - 2x_c|)(2\eta f'(x_c))^{-1} \times \tag{20}$$
$$\text{Im}[\text{erf}(-z_2, -z_1)^2 \exp(i\eta(T\phi - 2\phi x_c) - i\epsilon(T - 2x_c))];$$

$$R_{12} = R_{21} = \tag{21}$$
$$\frac{\left|[\text{erf}(z_2) - \text{erf}(z_1)]\right||e^{\gamma x_c}\sqrt{2\pi}}{\sqrt{\eta f'(x_c)(\gamma^2 + (\epsilon - \eta)^2)}}|\exp(-\gamma) - \exp(\gamma(1 - T) - iT(\epsilon - \eta))| \times$$
$$\cos\left[-\arg(\gamma - i(\epsilon - \eta)) - \arg(\exp(\gamma(1 - T) - iT(\epsilon - \eta))) - \right.$$
$$\left.\arg([\text{erf}(z_2) - \text{erf}(z_1)]) - \epsilon(x_c - 1) + \eta\phi x_c - \eta(\phi + 2) - \frac{\pi}{4}\right];$$

and $$R_{23} = R_{32} = (\eta f'(x_c)(\gamma^2 + (\epsilon - \eta)^2))^{-\frac{1}{2}} \times \tag{22}$$
$$\sqrt{\frac{\pi}{2}} (\exp((T - 1)(\gamma + i(\epsilon - \eta))) - \exp(\gamma + i(\epsilon - \eta))) \times$$
$$\exp(-\gamma(T - x_c) + i(\epsilon(x_c - T) + \eta(-\phi x_c + T\phi - \phi + 1)));$$

where $x_c$ and $y_c$ are stationary points when the qubit frequency reaches the TLS frequency during the ramping up or ramping down of the frequency control, and:

$$z_1 = -(1 - x_c)\exp\left(\frac{i\pi}{4}\right)\sqrt{\frac{\eta|f'(x_c)|}{2}}; \text{ and} \tag{23}$$

$$z_2 = (x_c)\exp\left(\frac{i\pi}{4}\right)\sqrt{\frac{\eta|f'(x_c)|}{2}}. \tag{24}$$

Advantageously, in some instances, the closed-form prediction model disclosed herein further decreases the computation cost associated with evaluating the physical model (e.g., by avoiding numerical integration), allowing the machine-learned parameter value prediction model to execute more training iterations for a given computational budget.

As described above, example physical models for $P_{decay}$ (e.g., from Equation 5 or 17) can be used to train a machine-learned parameter value prediction model to extract physical parameters from experimental data (e.g., TSSD). In some embodiments, these physical parameters may then be used to estimate and/or predict an error or fidelity measure describing a qubit gate, such as a two-qubit quantum gate.

For example, in one embodiment, a general form of a two-qubit quantum gate can be expressed as in Equation 25, $$U_2(g, t_2, \omega_q) = \begin{pmatrix} 1 & 0 & 0 & 0 \\ 0 & e^{-i\omega_q t_2}\cos(\theta) & -i\sin(\theta)e^{i\omega_q t_2} & 0 \\ 0 & -i\sin(\theta)e^{i\omega_q t_2} & e^{-i\omega_q t_2}\cos(\theta) & 0 \\ 0 & 0 & 0 & e^{-i2\omega_q t_2}w_{11} \end{pmatrix} \tag{25}$$

where:
  $t_2$ is a gate time;
  $\omega_q$ is a qubit interaction frequency;
  g is descriptive of a two-qubit interaction (e.g., coupling strength)

$$g(\sigma_1^x \sigma_2^x + \sigma_1^y \sigma_2^y) \tag{26}$$

activated by a tunable coupled for the gate time $t_2$ resulting in a rotation $$\theta = g t_2, \tag{27}$$

after which the interaction can be turned off and each qubit detuned back to $f_{idle}$; and
  $w_{11}$ is defined in Equation 28 as a function of coupling strength g, time t, and an anharmonicity parameter $\eta_{BH}$.

$$w_{11}(t_2, g, \eta_{BH}) = \tag{28}$$

$$\exp\left(i\frac{1}{2}t_2\eta_{BH}\right)\left(\cos\left(\frac{1}{2}t\sqrt{16g^2+\eta_{BH}^2}\right) - \frac{i\eta_{BH}^2\sin\left(\frac{1}{2}t\sqrt{16g^2+\eta_{BH}^2}\right)}{\sqrt{16g^2+\eta_{BH}^2}}\right)$$

The density operator associated with the two-qubit quantum gate described above can be expressed, in one embodiment, by an operator sum description, such as by Kraus operators $V_{k1,k2,k3,k4}$ as in Equation 29, $$\rho(t_2) = \sum_{k_1,k_2,k_3,k_4 \in \{0,1\}} V_{k_1,k_2,k_3,k_4}\rho(0)V_{k_1,k_2,k_3,k_4}^\dagger \tag{29}$$

where the nonzero Kraus operators are defined as:

$$V_{0,0,0,0} = \tag{30}$$

$$-\frac{1}{\hbar^2}\sum_{\alpha=1,2}\lambda_\alpha^2\left[\hat{X}_\alpha'(t_2, \omega_{TLS,\alpha}, \Gamma_{TLS_\alpha,\phi}, \omega_q, g, \eta_{BH})\hat{X}_\alpha'(t_2, -\omega_{TLS,\alpha}, \Gamma_{TLS_\alpha,\phi},\right.$$

$$\omega_q, g, \eta_{BH}) - i\hat{Y}_\alpha'(t_2, \omega_{TLS,\alpha}, \Gamma_{TLS_\alpha,\phi}, \omega_q, g, \eta_{BH})$$

$$\hat{X}_\alpha'(t_2, -\omega_{TLS,\alpha}, \Gamma_{TLS_\alpha,\phi}, \omega_q, g, \eta_{BH}) + i\hat{X}_\alpha'(t_2, \omega_{TLS,\alpha}, \Gamma_{TLS_\alpha,\phi},$$

$$\omega_q, g, \eta_{BH})\hat{Y}_\alpha'(t_2, -\omega_{TLS,\alpha}, \Gamma_{TLS_\alpha,\phi}, \omega_q, g, \eta_{BH}) + \hat{Y}_\alpha'(t_2, \omega_{TLS,\alpha},$$

$$\left.\Gamma_{TLS_\alpha,\phi}, \omega_q, g, \eta_{BH})\hat{Y}_\alpha'(t_2, -\omega_{TLS,\alpha}, \Gamma_{TLS_\alpha,\phi}, \omega_q, g, \eta_{BH})\right]$$

$$V_{1,0,1,0} = -\frac{i}{2\hbar}\lambda_1\left[\hat{X}_1'(t_2, -\omega_{TLS,\alpha}, \Gamma_{TLS_\alpha,\phi}, \omega_q, g, \eta_{BH}) + \right. \tag{31}$$

$$\left.\hat{Y}_1'(t_2, -\omega_{TLS,\alpha}, \Gamma_{TLS_\alpha,\phi}, \omega_q, g, \eta_{BH})\right]$$

$$V_{0,1,0,1} = -\frac{i}{2\hbar}\lambda_2\left[\hat{X}_2'(t_2, -\omega_{TLS,\alpha}, \Gamma_{TLS_\alpha,\phi}, \omega_q, g, \eta_{BH}) + \right. \tag{32}$$

$$\left.\hat{Y}_2'(t_2, -\omega_{TLS,\alpha}, \Gamma_{TLS_\alpha,\phi}, \omega_q, g, \eta_{BH})\right]$$

$$V_{1,1,1,1} = \tag{33}$$

$$-\frac{1}{\hbar^2}\sum_{\substack{\alpha=1,2\\ \beta\neq\alpha}}\lambda_\alpha g_\beta\left[\hat{X}_\alpha'(t_2, -\omega_{TLS,\alpha}, \Gamma_{TLS_\alpha,\phi}, \omega_q, g, \eta_{BH})\hat{X}_\beta'(t_2, -\omega_{TLS,\beta},\right.$$

$$\left.\Gamma_{TLS_\beta,\phi}, \omega_q, g, \eta_{BH}) + i\hat{Y}_\alpha'(t_2, -\omega_{TLS,\alpha}, \Gamma_{TLS_\alpha,\phi}, \omega_q, g, \eta_{BH})\right.$$

-continued $$\left.\hat{X}_\alpha'(t_2, -\omega_{TLS,\alpha}, \Gamma_{TLS_\alpha,\phi}, \omega_q, g, \eta_{BH})\right]$$

with $$\hat{X}_\alpha'(t, -\omega_{TLS,\alpha}, \Gamma_{TLS_\alpha,\phi}, \omega_q, g, \eta_{BH}) = \begin{pmatrix} 0 & -iA_3 & A_4 & 0 \\ iA_1 & 0 & 0 & iA_7 \\ A_2 & 0 & 0 & iA_8 \\ 0 & A_5 & -iA_6 & 0 \end{pmatrix} \tag{34}$$

$$\hat{Y}_\alpha'(t, -\omega_{TLS,\alpha}, \Gamma_{TLS_\alpha,\phi}, \omega_q, g, \eta_{BH}) = \begin{pmatrix} 0 & -A_3 & -iA_4 & 0 \\ -A_1 & 0 & 0 & -iA_7 \\ iA_2 & 0 & 0 & iA_8 \\ 0 & iA_5 & A_6 & 0 \end{pmatrix} \tag{35}$$

$$\hat{X}_2'(t, -\omega_{TLS,\alpha}, \Gamma_{TLS_\alpha,\phi}, \omega_q, g, \eta_{BH}) = \begin{pmatrix} 0 & A_4 & -iA_3 & 0 \\ A_2 & 0 & 0 & iA_8 \\ A_1 & 0 & 0 & A_7 \\ 0 & -iA_6 & -iA_5 & 0 \end{pmatrix} \tag{36}$$

$$\hat{Y}_2'(t, -\omega_{TLS,\alpha}, \Gamma_{TLS_\alpha,\phi}, \omega_q, g, \eta_{BH}) = \begin{pmatrix} 0 & -iA_4 & -A_3 & 0 \\ iA_2 & 0 & 0 & A_8 \\ -A_1 & 0 & 0 & -iA_7 \\ 0 & A_6 & iA_5 & 0 \end{pmatrix} \tag{37}$$

where $$A_1 = \int_0^t \xi_{x,x,\alpha}(\tau)e^{-i\tau\omega_{TLS,\alpha}}e^{i\tau\omega_q}\sin(g\tau)d\tau \tag{38}$$

$$A_2 = \int_0^t \xi_{x,x,\alpha}(\tau)e^{-i\tau\omega_{TLS,\alpha}}e^{i\tau\omega_q}\cos(g\tau)d\tau \tag{39}$$

$$A_3 = \int_0^t \xi_{x,x,\alpha}(\tau)e^{-i\tau\omega_{TLS,\alpha}}e^{-i\tau\omega_q}\sin(g\tau)d\tau \tag{40}$$

$$A_4 = \int_0^t \xi_{x,x,\alpha}(\tau)e^{-i\tau\omega_{TLS,\alpha}}e^{-i\tau\omega_q}\cos(g\tau)d\tau \tag{41}$$

$$A_5 = \int_0^t \xi_{x,x,\alpha}(\tau)e^{-i\tau\omega_{TLS,\alpha}}e^{i\tau\omega_q}\cos(g\tau)w_{11}(\tau, g, -\eta_{BH})d\tau \tag{42}$$

$$A_6 = \int_0^t \xi_{x,x,\alpha}(\tau)e^{-i\tau\omega_{TLS,\alpha}}e^{i\tau\omega_q}\sin(g\tau)w_{11}(\tau, g, -\eta_{BH})d\tau \tag{43}$$

$$A_7 = \int_0^t \xi_{x,x,\alpha}(\tau)e^{-i\tau\omega_{TLS,\alpha}}e^{-i\tau\omega_q}\cos(g\tau)w_{11}(\tau, g, \eta_{BH})d\tau \tag{44}$$

$$A_8 = \int_0^t \xi_{x,x,\alpha}(\tau)e^{-i\tau\omega_{TLS,\alpha}}e^{-i\tau\omega_q}\sin(g\tau)w_{11}(\tau, g, \eta_{BH})d\tau \tag{45}$$

where the correlatore $\xi_{x,x,\alpha}(\tau)$ is unsymmetrized and given by the response function of the TLS. In one embodiment, $$\xi_{x,x,\alpha}(\tau) = \langle\sigma_{TLS,\alpha}^x(\tau)\sigma_{TLS,\alpha}^x(0)\rangle, \tag{46}$$

and in one embodiment, an exponential delay function can be selected such that $$\xi_{x,x,\alpha}(\tau) = \exp(-\tau\Gamma_{TLS_\alpha,\phi}). \tag{47}$$

The amplitudes for each two-qubit Pauli operator for all non-zero Kraus operators are provided in Tables 1-3.

TABLE 1

| $\sigma_1{}^z\sigma_2{}^z$ | $\sigma_1{}^x\sigma_2{}^x + \sigma_1{}^y\sigma_2{}^y$ | $\sigma_1{}^x\sigma_2{}^y - \sigma_1{}^y\sigma_2{}^x$ |
|---|---|---|
| $V_{0,0,0,0}$ $\quad \lambda_1{}^2|FST_1| + \lambda_2{}^2|FCT_2|$ | $i\frac{1}{2}\left[\lambda_1^2 Re(\beta_\alpha) + \lambda_2^2 Im(\beta_\alpha)\right]$ | $i\frac{1}{2}\left[\lambda_1^2 Im(\beta_\alpha) + \lambda_2^2 Re(\beta_\alpha)\right]$ |

TABLE 2

| | $\sigma_1{}^z\sigma_2{}^x + i\sigma_1{}^z\sigma_2{}^y$ | $\sigma_1{}^x\sigma_2{}^z + \sigma_1{}^y\sigma_2{}^z$ |
|---|---|---|
| $V_{0,1,0,1}$ | $\frac{1}{4}\lambda_2(FCT_2 - FCWT_2)$ | $-i\frac{1}{4}\lambda_2(FST_2 + FSWT_2)$ |
| $V_{1,0,1,0}$ | $\frac{1}{4}\lambda_1(-iFST_1 - FSWT_1)$ | $\frac{1}{4}\lambda_1(FCT_1 - FCWT_1)$ |

TABLE 3

| | $\sigma_1{}^x\sigma_2{}^x - \sigma_1{}^y\sigma_2{}^y$ | $\sigma_1{}^x\sigma_2{}^y + \sigma_1{}^y\sigma_2{}^x$ |
|---|---|---|
| $V_{1,1,1,1}$ | $\frac{1}{4}(FST_1 \times FSWT_2 - FCWT_1 \times FCT_2)$ | $i\frac{1}{4}(FST_1 \times FSWT_2 - FCWT_1 \times FCT_2)$ |

Terms used in Tables 1-3 are defined below:

$$FCT_\alpha = \int_0^\tau \xi_{x,x,\alpha}(\tau)e^{i\tau\omega TLS,\alpha}e^{-i\tau\omega q}\cos(g\tau)d\tau \tag{48}$$

$$FST_\alpha = \int_0^\tau \xi_{x,x,\alpha}(\tau)e^{i\tau\omega TLS,\alpha}e^{-i\tau\omega q}\sin(g\tau)d\tau \tag{49}$$

$$FCWT_\alpha = \int_0^\tau \xi_{x,x,\alpha}(\tau)e^{i\tau\omega TLS,\alpha}e^{-i\tau\omega q}\cos(g\tau)w_{11}(\tau, g, \eta_{BH})d\tau \tag{50}$$

$$FSWT_\alpha = \int_0^\tau \xi_{x,x,\alpha}(\tau)e^{i\tau\omega TLS,\alpha}e^{-i\tau\omega q}\sin(g\tau)w_{11}(\tau, g, \eta_{BH})d\tau \tag{51}$$

$$\beta_\alpha = FCT_\alpha FST_\alpha^* \tag{52}$$

In some embodiments, systems and methods according to example aspects of the present disclosure can use two-qubit gate models (e.g., as described herein, or other models) to describe or predict error or fidelity measures. For instance, given an n-qubit gate represented by a d×d dimensional unitary *U with d=2$^n$, an average fidelity $F_{avg}$ can be defined in Equation 53, $$F_{avg} = \frac{dF_e + 1}{d + 1} \tag{53}$$

where the set of nonzero Kraus operators are represented by V to provide $$F_e = \frac{1}{d^2}\sum_k |Tr[UV(k)^\dagger]|^2. \tag{54}$$

In some examples, the set of nonzero Kraus operators described above in Equations 30-33 may be used to estimate and/or predict a fidelity measure of a two-qubit quantum gate, such as a two-qubit quantum gate characterized by the set of parameters predicted by the machine-learned parameter value prediction model of the present disclosure.

In some embodiments, Kraus operators can also be used to calculate the unitarity of a quantum channel v, defined as $$u(v) = \frac{d-1}{d}\int d\psi v'(\psi)^\dagger v'(\psi) \tag{55}$$

where

-continued $$v'(\rho) = v(\rho) - Tr\left[\frac{v(\rho)}{\sqrt{d}}\right]\mathbb{1} \tag{56}$$

The rescaled non-unitary can be expressed as $$u'(v) = \frac{d-1}{d}\left(1 - \sqrt{u(v)}\right). \tag{57}$$

In some embodiments, Equation 57 can provide the average gate error, such as when a noise channel is purely decoherence.

Figure 2:
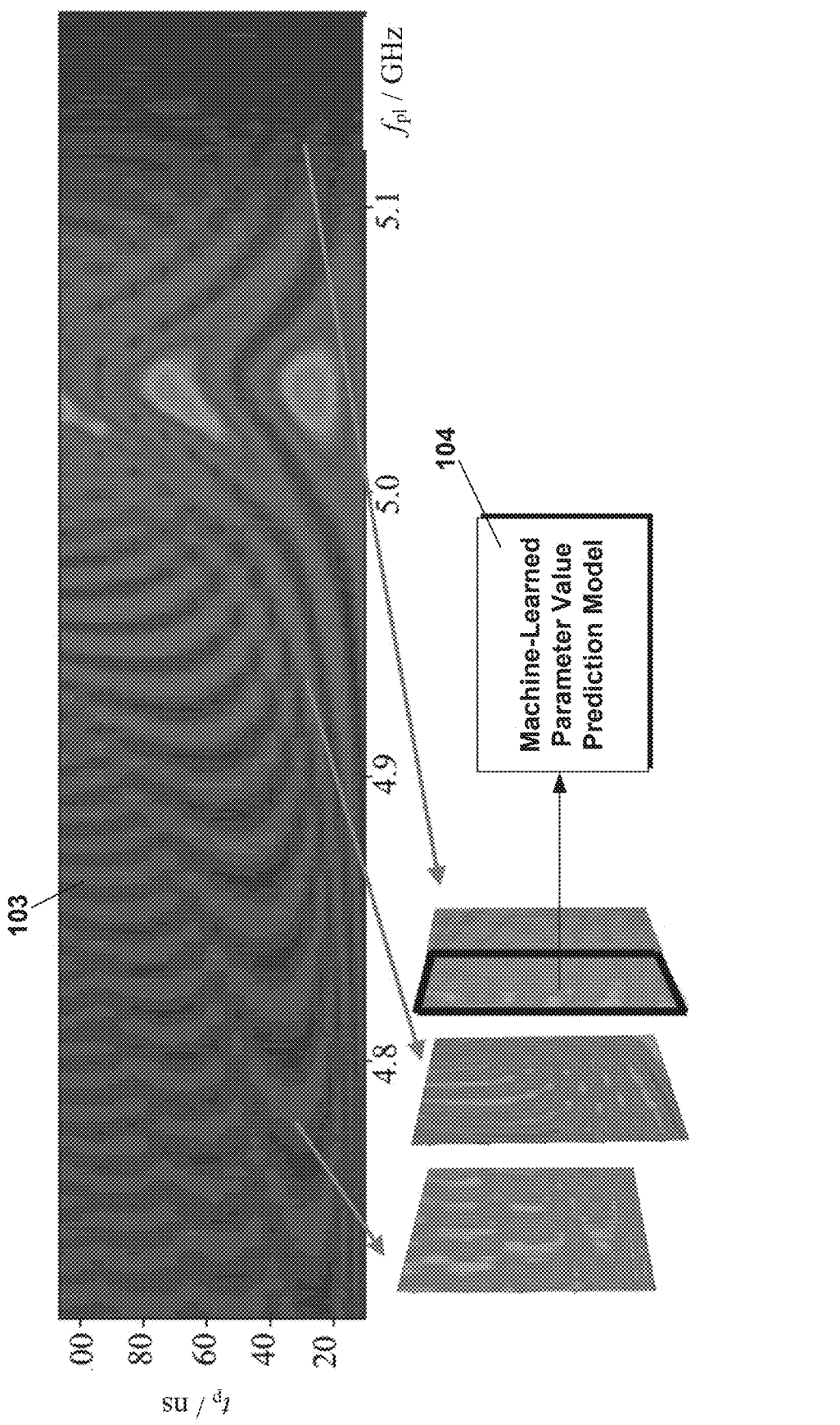
FIG. 2 depicts an example approach for inputting experimental data into a machine-learned model according to example embodiments of the present disclosure.

As shown in FIG. 1 and described above, one or more physical models (e.g., physical model 108, such as the physical model(s) described in Equations 5 and/or 17) can be used in a computing system 100 for training a machine-learned parameter value prediction model 104. In general, the machine-learned parameter value prediction model 104 can comprise any suitable machine-learned model structure (e.g., neural network, deep neural network, neural network comprising one or more convolutional layers, other suitable machine-learned models, etc.). Example embodiments of the machine-learned parameter value prediction model 104 are configured to receive, as one or more inputs, TSSD 102, such as shown in one example embodiment in FIG. 2. For instance, sections or regions of TSSD (e.g., as shown in TSSD plot 103) may be segmented and/or joined in one or more input structure(s) and fed into a machine-learned parameter value prediction model 104.

In some embodiments, a computing system 100 can obtain an initialized set of weights for the machine-learned parameter value prediction model 104 configured to predict one or more parameter values 106 for one or more parameters of the physical model 108 that is configured to predict a performance of the quantum computing system (e.g., a TSSD measurement). For example, in some implementations, the initialized set of weights can be a randomized set of weights. In some implementations, the initialized set of weights can be a previously determined set of weights, such as a set of weights determined from previously training the machine-learned parameter value prediction model 104.

In one example, the machine-learned parameter value prediction model 104 can be trained by using an evolutionary training scheme. However, it is contemplated that the machine-learned parameter value prediction model 104 can be trained by any suitable training scheme (e.g., gradient based training).

In one example, evolutionary training can include perturbing the initialized set of weights of the machine-learned parameter value prediction model 104. For example, in some implementations, the plurality of perturbations can be generated by perturbing the initialized set of weights around a zero mean Gaussian distribution with a variance parameter.

The set of experimental data (e.g., TSSD 102) can be input into each perturbation of the machine-learned parameter value prediction model 104. The machine-learned parameter value prediction model 104 can then output a respective predicted parameter value set 106 for the physical model 108. Each predicted parameter value set 106 can include one or more predicted parameter values.

In some implementations, as described above, the physical model 108 can be configured to predict a probability of qubit decay for the one or more qubits of a quantum gate based at least in part on an input that describes a plateau frequency and a hold time for the one or more qubits. As another example, a physical model (e.g., a physical model 108, a physical model 142) can be configured to predict a probability of gate fidelity for the quantum gate based at least in part on an input that describes a gate interaction frequency and a gate time for the quantum gate. In some implementations, the quantum gate can include a two-qubit quantum gate.

In some implementations, the physical model 108, 142 can be a model which includes a model of non-Markovian quantum dynamics of interactions between one or more qubits and one or more TLS defects during operation of the quantum gate.

As described above, the predicted parameter value set 106 obtained from the machine-learned parameter value prediction model 104 can include one or more parameters used by the physical model 108, 142. As examples, the one or more parameters used by the physical model 108, 142 can include: a dephasing rate parameter (e.g., a TLS dephasing rate parameter or a dephasing rate parameter that equals a sum of a qubit dephasing rate parameter and a TLS dephasing rate parameter); a TLS frequency parameter that describes a frequency associated with the one or more TLS defects; a coupling strength parameter that describes a coupling strength between the one or more qubits and the one or more TLS defects; and/or a ramp time parameter (e.g., which may equal a fixed value). These parameters can be in addition, for example, to parameters that are typically provided as experimental inputs to the physical model to provide a prediction of system behavior at such input parameters. As examples, the experimental input parameters can include the plateau frequency (e.g., a range thereof) and/or the hold time (e.g., a range thereof).

A respective set of predicted data 110 for the quantum computing system can then be generated over a set of experimental inputs 107. For example, each set of predicted data 110 can be generated by the computing system 100 using the physical model 108 having the respective predicted parameter value set 106. Each respective set of predicted data 110 can be descriptive of a predicted performance of the quantum computing system. For example, in some implementations, the respective predicted parameter value set 106 can be a reconstruction corresponding to the experimental data, such as TSSD 102.

Figure 3B:
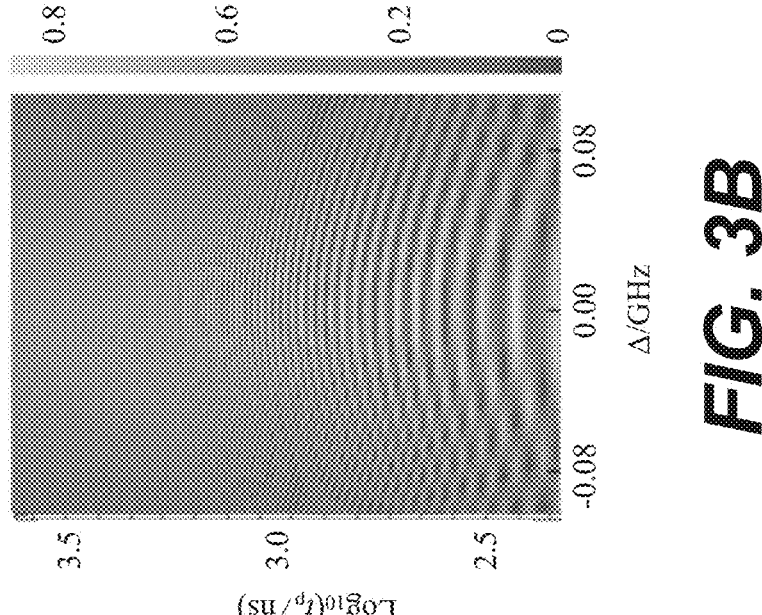
FIG. 3B depicts an example experimental measurement according to example embodiments of the present disclosure.
Figure 3A:
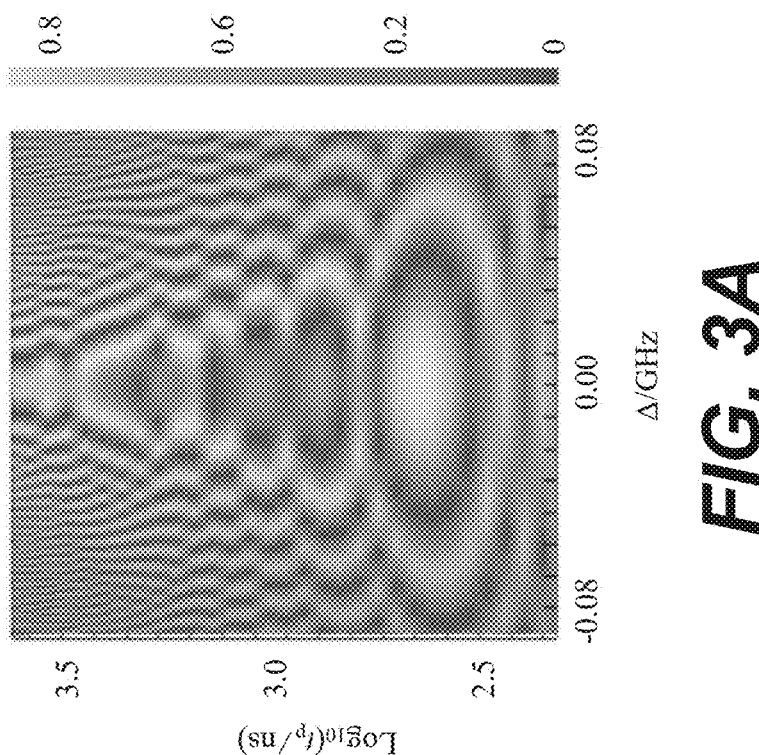
FIG. 3A depicts an example experimental measurement according to example embodiments of the present disclosure.

In some embodiments, the experimental inputs 107 can correspond to the inputs provided to the experimental system to obtain the experimental data (e.g., TSSD 102). For instance, in some implementations, the set of experimental data can be obtained by collecting TSSD 102 with non-uniform temporal sampling to amplify the temporal periodicity of non-Markovian oscillation patterns (e.g., similar to the Moiré effect), as shown in FIGS. 3A and 3B. For instance, FIG. 3A depicts an example set of TSSD collected using non-uniform temporal sampling (e.g., based on non-uniform step size, such as logarithmic step size between samples), and illustrates the additional circular oscillations with increased period. FIG. 3B depicts the TSSD observed with uniform temporal sampling (e.g., uniform step size). Advantageously, the increased period illustrated in FIG. 3A permits detection and/or measurement using a lower sample rate (e.g., based on the Nyquist theorem). In some embodiments, the experimental inputs can be determined to reflect a non-uniform temporal sampling scheme.

The method can further include evaluating a loss and/or objective 112 for the plurality of perturbations of the machine-learned parameter value prediction model 104. The loss and/or objective 112 can evaluate a difference between the set of experimental data and the corresponding set of predicted data 110 for each respective perturbation.

For example, in some implementations, evaluating the objective 112 can include determining a respective cost function for each perturbation of the plurality of perturbations. The cost function for each respective perturbation can be determined based at least in part on a difference between the experimental data (e.g., TSSD 102) and the predicted data 110. In some implementations, the cost function can include determining an $L_2$ norm of the difference. In some implementations, the objective 112 can be a reward function. In other implementations, other suitable objectives 112 can be used.

The method can further include modifying the initialized set of weights for the machine-learned parameter value prediction model 104 based at least in part on the objective 112. For example, in some implementations, modifying the initialized set of weights for the machine-learned parameter value prediction model 104 can include modifying the initialized set of weights based at least in part on a weighted average of the perturbations. For example, the objective 112 can be a respective cost function for each perturbation, and a respective contribution of each respective perturbation to the weighted average can be a function of the respective cost function. When other training schemes are used (e.g., gradient based training), one or more weights and/or parameters of the machine-learned parameter value prediction model 104 may be updated and/or modified according to other methods, such as backpropagation.

In some implementations, the initialized set of weights can be modified based at least in part on the weighted average of the perturbations by adding a multiplication of the weighted average of the perturbations and a learning rate parameter to the initialized set of weights.

In some implementations, the method can be performed for a plurality of iterations, and following an initial iteration, the initialized set of weights for each successive iteration can include a modified set of weights determined by a previous iteration. For example, the modified set of weights determined in the most recent iteration can be used as the initialized set of weights for a successive (e.g., current) iteration.

In this way, the machine-learned parameter value prediction model 104 can be trained using an objective 112 using an evolutionary algorithm through forward propagation. Further, respective values for at least some of the plurality of parameters of the physical model 108 can additionally be learned based at least in part on swap spectroscopy data. For example, a computing system can perform swap spectroscopy (e.g., obtaining TSSD 102) to observe behavior of the system at various combinations of different plateau frequencies and hold times. A computing system 100 (which could be the same or different computing system as that which obtains TSSD 102) can perform a learning algorithm using the observed swap spectroscopy data as training data to learn the values of the parameters 106 of the physical model 108, 142. For example, in some example implementations, an additional machine-learned model (e.g., neural network) can learn (e.g., via an evolutionary learning approach) to predict values for the parameters of the physical model based on observed swap spectroscopy data. In particular, the additional machine-learned model can learn to predict parameter values that allow for the physical model to reproduce the swap spectroscopy data (e.g., an ideal version of the swap spectroscopy data) that was provided as input to the additional machine-learned model.

While the present disclosure describes one embodiment using an objective 112 and an evolutionary algorithm through forward propagation to learn the machine-learned parameter value prediction model, in some implementations, other suitable training methods can also be used without deviating from the scope of the present disclosure. For example, as previously mentioned, in some implementations, gradient-based (e.g., stochastic gradient descent) learning can be used.

The systems and methods of the present disclosure provide a number of technical effects and benefits. As one example, the gate-dependent error model described herein points to a new direction of using qubits as sensors to characterize not only the practical imperfections in a qubit's environment but also the non-idealities in the qubit's control actuation. These findings can assist with development of the next generation of quantum devices for large-scale quantum computation, including improving fidelity and robustness against realistic experimental limitation and imperfection.

Moreover, the practical quantum noise channel description offered by the present disclosure provides a pathway to the evaluation of the performance of noisy-intermediate scale processors in realizing gate-based quantum algorithms. In addition, quantum gate fidelity is the sole parameter upon which the fault-tolerance quantum computation depends for a scalable implementation of quantum computation with millions of qubits. Therefore, being able to infer this value is beneficial for ensuring the delivery of a large scale quantum computing architecture.

As another example technical effect, the systems and methods described herein represent an important tool to assist in better understanding of the fundamental limitations of a quantum device and, in turn, the major limitations to quantum computation. Such connection between physical knowledge of the device and high-level performance evaluation also provides for automated device calibration, which benefits not just superconducting qubits but also other solid-state qubits that suffer from fabrication defects in the chip manufacturing process.

As another example technical effect, the systems and methods described herein provide for a reduction in TLS-induced error in quantum gates (e.g., through intelligence and TLS-aware selection/calibration of quantum gate control values). Reducing errors in the quantum gate can provide improved performance of the quantum computer (e.g., more accurate computational results). Reducing errors in the quantum gate can also conserve computing resources (e.g., processor usage, memory usage, etc.) by enabling the correct computational result to be obtained in fewer computational iterations overall.

As another example technical effect, the systems and methods described herein provide for rapid (e.g., approximately real-time) learning and modification of a machine-learned parameter value prediction model. This can allow for fine-tuning of physical model parameters to account for TLS fluctuations, thereby allowing for essentially real-time error characterization and error mitigation schemes to be implemented.

With reference again to the FIGS., additional example embodiments of systems and methods regarding the present disclosure will be discussed in further detail.

Example Systems

Figure 4:
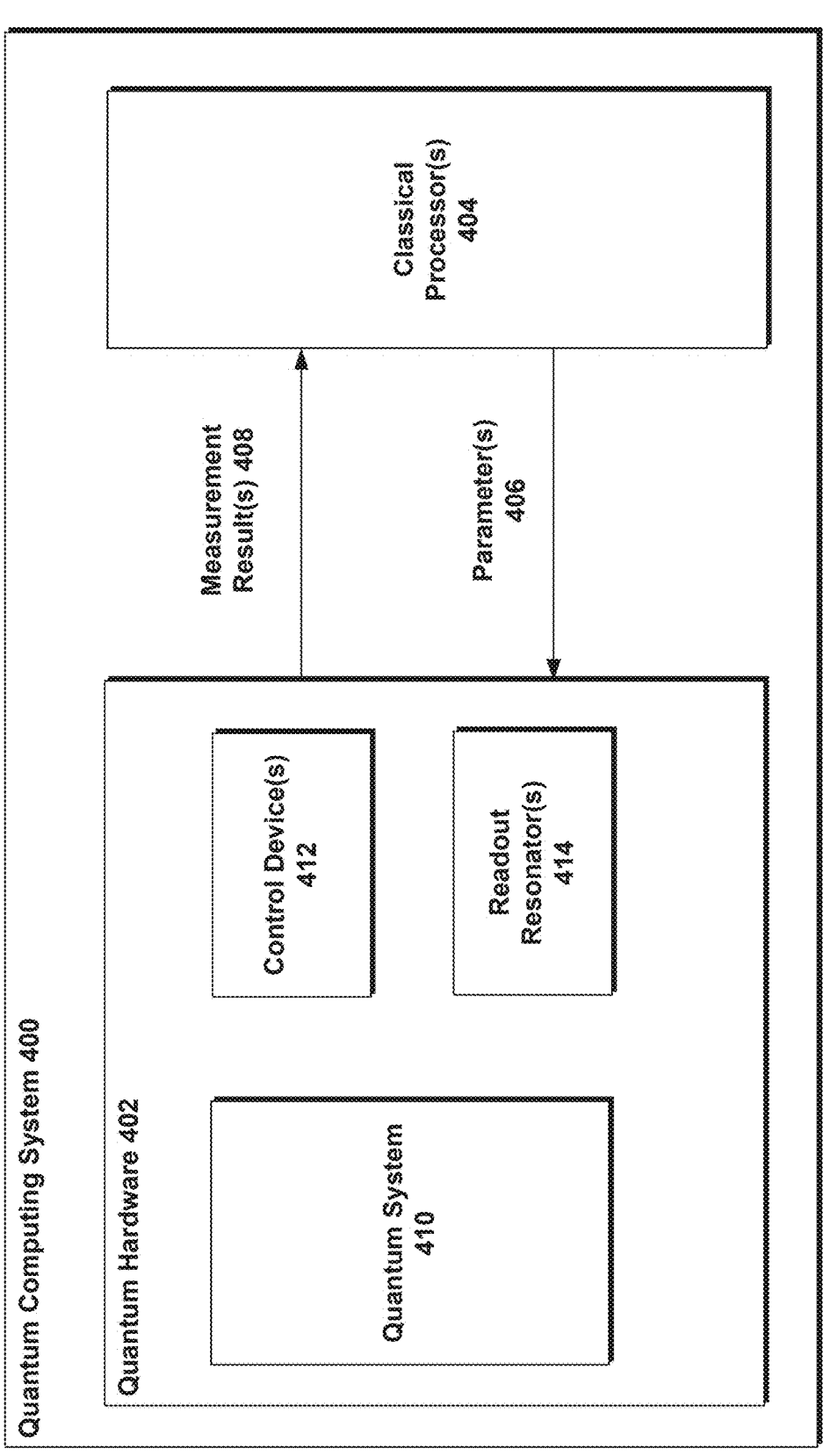
FIG. 4 depicts an example quantum computing system according to example embodiments of the present disclosure.

FIG. 4 depicts an example quantum computing system 400. The system 400 is an example of a system implemented as classical or quantum computer program on one or more classical computers or quantum computing devices in one or more locations, in which the systems, components, and techniques described below can be implemented.

The system 400 includes quantum hardware 402 in data communication with one or more classical processors 404. The quantum hardware 402 includes components for performing quantum computation. For example, the quantum hardware 402 includes a quantum system 410, control device(s) 412, and readout resonator(s) 414. The quantum system 410 can include one or more multi-level quantum subsystems, such as a register of qubits. In some implementations, the multi-level quantum subsystems can include superconducting qubits, such as flux qubits, charge qubits, transmon qubits, etc.

The type of multi-level quantum subsystems that the system 400 utilizes may vary. For example, in some cases it may be convenient to include one or more readout resonators 414 attached to one or more superconducting qubits, e.g., transmon, flux, Gmon, Xmon, or other qubits. In other cases, ion traps, photonic devices or superconducting cavities (with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 410 via multiple control lines that are coupled to one or more control devices 412. Example control devices 412 that operate on the register of qubits include quantum logic gates or circuits of quantum logic gates, e.g., Hadamard gates, controlled-NOT (CNOT) gates, controlled-phase gates, or T gates. In some implementations T gates may be stored in one or more T factories included in the quantum hardware 402. The one or more control devices 412 may be configured to operate on the quantum system 410 through one or more respective control parameters (e.g., one or more physical control parameters). For example, in some implementations the multi-level quantum subsystems may be superconducting qubits and the control devices 412 may include one or more digital to analog converters (DACs) with respective voltage physical control parameters.

The quantum hardware 402 may further include measurement devices, e.g., readout resonators 414. Measurement results 408 obtained via measurement devices may be provided to the classical processors 404 for processing and analyzing. In some implementations, the quantum hardware 402 may include a quantum circuit and the control device(s) 412 and readout resonator(s) 414 may include one or more quantum logic gates that operate on the quantum system 402 through microwave pulse physical control parameters that are sent through wires included in the quantum hardware 402. Further examples of control devices include arbitrary waveform generators, wherein a DAC creates the signal. The control parameters may include qubit frequencies.

The readout resonator(s) 414 may be configured to perform quantum measurements on the quantum system 410 and send measurement results 408 to the classical processors 404. In addition, the quantum hardware 402 may be configured to receive data specifying physical control parameter values 406 from the classical processors 404. The quantum hardware 402 may use the received physical control parameter values 406 to update the action of the control device(s) 412 and readout resonator(s) 414 on the quantum system 410. For example, the quantum hardware 402 may receive data specifying new values representing voltage strengths of one or more DACs included in the control devices 412 and may update the action of the DACs on the quantum system 410 accordingly.

The classical processors 404 may be configured to initialize the quantum system 410 in an initial quantum state, e.g., by sending data to the quantum hardware 402 specifying an initial set of parameters 406.

Figure 5A:
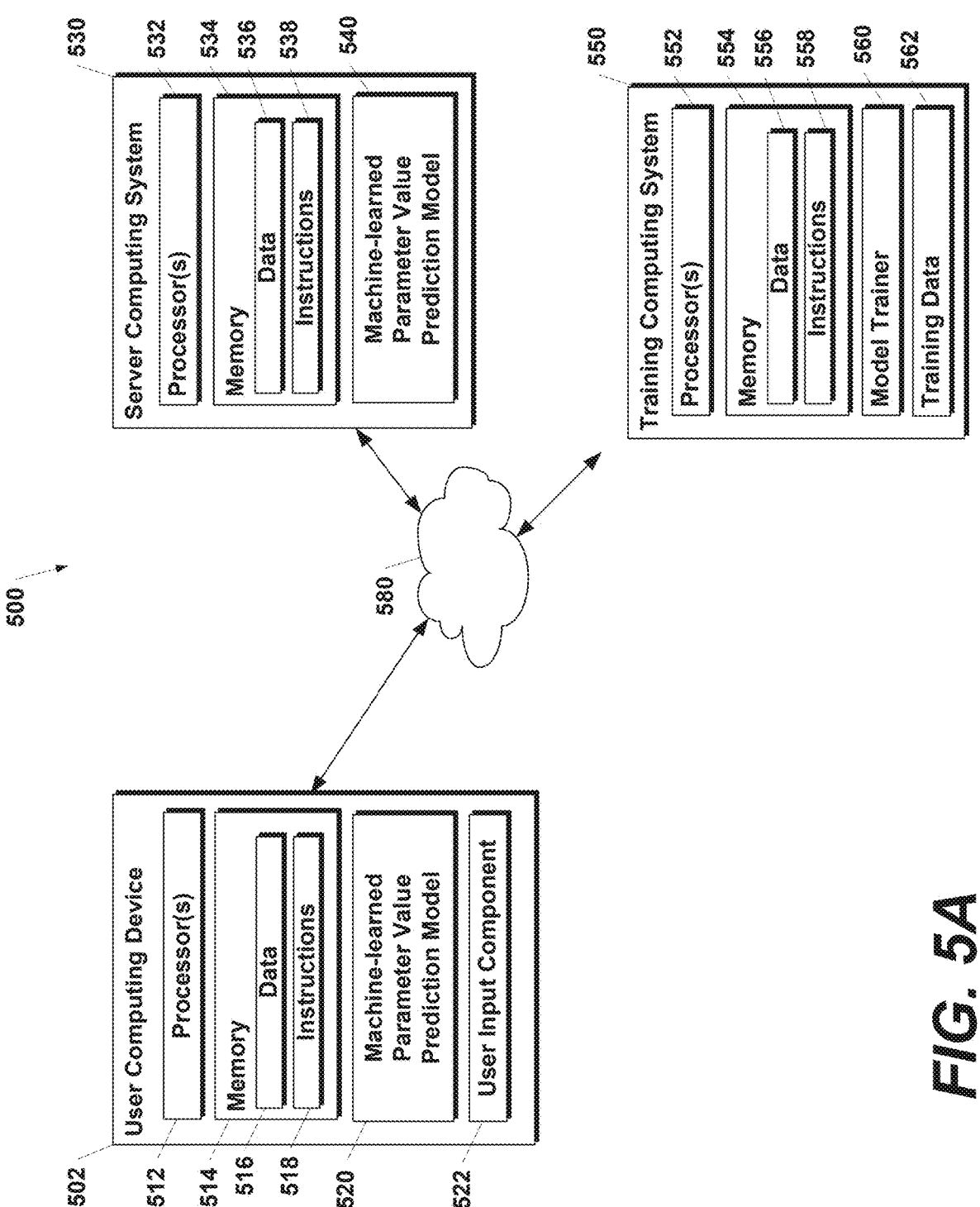
FIG. 5A depicts a block diagram of an example computing system that performs learning of a machine-learned parameter value prediction model according to example embodiments of the present disclosure.

Referring now to FIG. 5A, a block diagram of an example computing system 500 that performs learning of a machine-learned parameter value prediction model according to example aspects of the present disclosure is depicted. The system 500 includes a user computing device 502, a server computing system 530, and a training computing system 550 that are communicatively coupled over a network 580.

The user computing device 502 can be any type of computing device, such as, for example, a personal computing device (e.g., laptop or desktop), a mobile computing device (e.g., smartphone or tablet), a gaming console or controller, a wearable computing device, an embedded computing device, or any other type of computing device.

The user computing device 502 includes one or more processors 512 and a memory 514. The one or more processors 512 can be any suitable processing device (e.g., a processor core, a microprocessor, an ASIC, a FPGA, a controller, a microcontroller, etc.) and can be one processor or a plurality of processors that are operatively connected. The memory 514 can include one or more non-transitory computer-readable storage mediums, such as RAM, ROM, EEPROM, EPROM, flash memory devices, magnetic disks, etc., and combinations thereof. The memory 514 can store data 516 and instructions 518 which are executed by the processor 512 to cause the user computing device 502 to perform operations.

In some implementations, the user computing device 502 can store or include one or more machine-learned parameter value prediction models 520. For example, the machine-learned parameter value prediction models 520 can be or can otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks.

Example machine-learned parameter value prediction models 520 are discussed with reference to FIG. 1.

In some implementations, the one or more machine-learned parameter value prediction models 520 can be received from the server computing system 530 over network 580, stored in the user computing device memory 514, and then used or otherwise implemented by the one or more processors 512. In some implementations, the user computing device 502 can implement multiple parallel instances of a single machine-learned parameter value prediction model 520 (e.g., to perform parallel parameter value prediction across multiple instances).

More particularly, the machine-learned parameter value prediction model 520 can be configured to predict a set of parameters for a physical model of a quantum computing system, as described herein.

Additionally, or alternatively, one or more machine-learned parameter value prediction models 540 can be included in or otherwise stored and implemented by the server computing system 530 that communicates with the user computing device 502 according to a client-server relationship. For example, the machine-learned parameter value prediction models 540 can be implemented by the server computing system 540 as a portion of a web service. Thus, one or more models 520 can be stored and implemented at the user computing device 502 and/or one or more models 540 can be stored and implemented at the server computing system 530.

The user computing device 502 can also include one or more user input components 522 that receives user input. For example, the user input component 522 can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

The server computing system 530 includes one or more processors 532 and a memory 534. The one or more processors 532 can be any suitable processing device (e.g., a processor core, a microprocessor, an ASIC, a FPGA, a controller, a microcontroller, etc.) and can be one processor or a plurality of processors that are operatively connected. The memory 534 can include one or more non-transitory computer-readable storage mediums, such as RAM, ROM, EEPROM, EPROM, flash memory devices, magnetic disks, etc., and combinations thereof. The memory 534 can store data 536 and instructions 538 which are executed by the processor 532 to cause the server computing system 530 to perform operations.

In some implementations, the server computing system 530 includes, or is otherwise implemented by, one or more server computing devices. In instances where the server computing system 530 includes plural server computing devices, such server computing devices can operate according to sequential computing architectures, parallel computing architectures, or some combination thereof.

As described above, the server computing system 530 can store or otherwise include one or more machine-learned parameter value prediction models 540. For example, the models 540 can be or otherwise include various machine-learned models. Example machine-learned models include neural networks or other multi-layer non-linear models. Example neural networks include feed forward neural networks, deep neural networks, recurrent neural networks, and convolutional neural networks. Example models 540 are discussed with reference to FIG. 3.

The user computing device 502 and/or the server computing system 530 can train the models 520 and/or 540 via interaction with the training computing system 550 that is communicatively coupled over the network 580. The training computing system 550 can be separate from the server computing system 530 or can be a portion of the server computing system 530.

The training computing system 550 includes one or more processors 552 and a memory 554. The one or more processors 552 can be any suitable processing device (e.g., a processor core, a microprocessor, an ASIC, a FPGA, a controller, a microcontroller, etc.) and can be one processor or a plurality of processors that are operatively connected. The memory 554 can include one or more non-transitory computer-readable storage mediums, such as RAM, ROM, EEPROM, EPROM, flash memory devices, magnetic disks, etc., and combinations thereof. The memory 554 can store data 556 and instructions 558 which are executed by the processor 552 to cause the training computing system 550 to perform operations. In some implementations, the training computing system 550 includes, or is otherwise implemented by, one or more server computing devices.

The training computing system 550 can include a model trainer 560 that trains the machine-learned models 520 and/or 540 stored at the user computing device 502 and/or the server computing system 530 using various training or learning techniques, such as, for example, an evolutionary algorithm using forward propagation. In some implementations, other training techniques can be used, such as backwards propagation of errors. In some implementations, performing backwards propagation of errors can include performing truncated backpropagation through time. The model trainer 560 can perform a number of generalization techniques (e.g., weight decays, dropouts, etc.) to improve the generalization capability of the models being trained.

In particular, the model trainer 560 can train the machine-learned parameter value prediction models 520 and/or 540 based on a set of training data 562. The training data 562 can include, for example, TSSD, as described herein. For example, a plurality of perturbations of the machine-learned parameter value prediction models 520 and/or 540 can be generated. The TSSD can be input into each perturbation of the machine-learned parameter value prediction models 520 and/or 540 to obtain a respective set of predicted parameter values for the physical model. The predicted parameter values can be used by the physical model along with a set of experimental data (e.g., a range of plateau frequencies and a range of hold times) to generate a reconstruction (e.g., a set of predicted data) corresponding to the TSSD for each perturbation. An objective function can be used, such as a cost function and/or reward function, which can compare the TSSD to the set of predicted data for each perturbation. The initial weights of the machine-learned parameter value prediction models 520 and/or 540 can then be modified based at least in part on the objective function, as described herein.

The model trainer 560 includes computer logic utilized to provide desired functionality. The model trainer 560 can be implemented in hardware, firmware, and/or software controlling a general purpose processor. For example, in some implementations, the model trainer 560 includes program files stored on a storage device, loaded into a memory and executed by one or more processors. In other implementations, the model trainer 560 includes one or more sets of computer-executable instructions that are stored in a tangible computer-readable storage medium such as RAM hard disk or optical or magnetic media.

The network 580 can be any type of communications network, such as a local area network (e.g., intranet), wide area network (e.g., Internet), or some combination thereof and can include any number of wired or wireless links. In general, communication over the network 580 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 5A illustrates one example computing system that can be used to implement the present disclosure. Other computing systems can be used as well. For example, in some implementations, the user computing device 502 can include the model trainer 560 and the training dataset 562. In such implementations, the models 520 can be both trained and used locally at the user computing device 502. In some of such implementations, the user computing device 502 can implement the model trainer 560 to personalize the models 520 based on user-specific data.

Figure 5B:
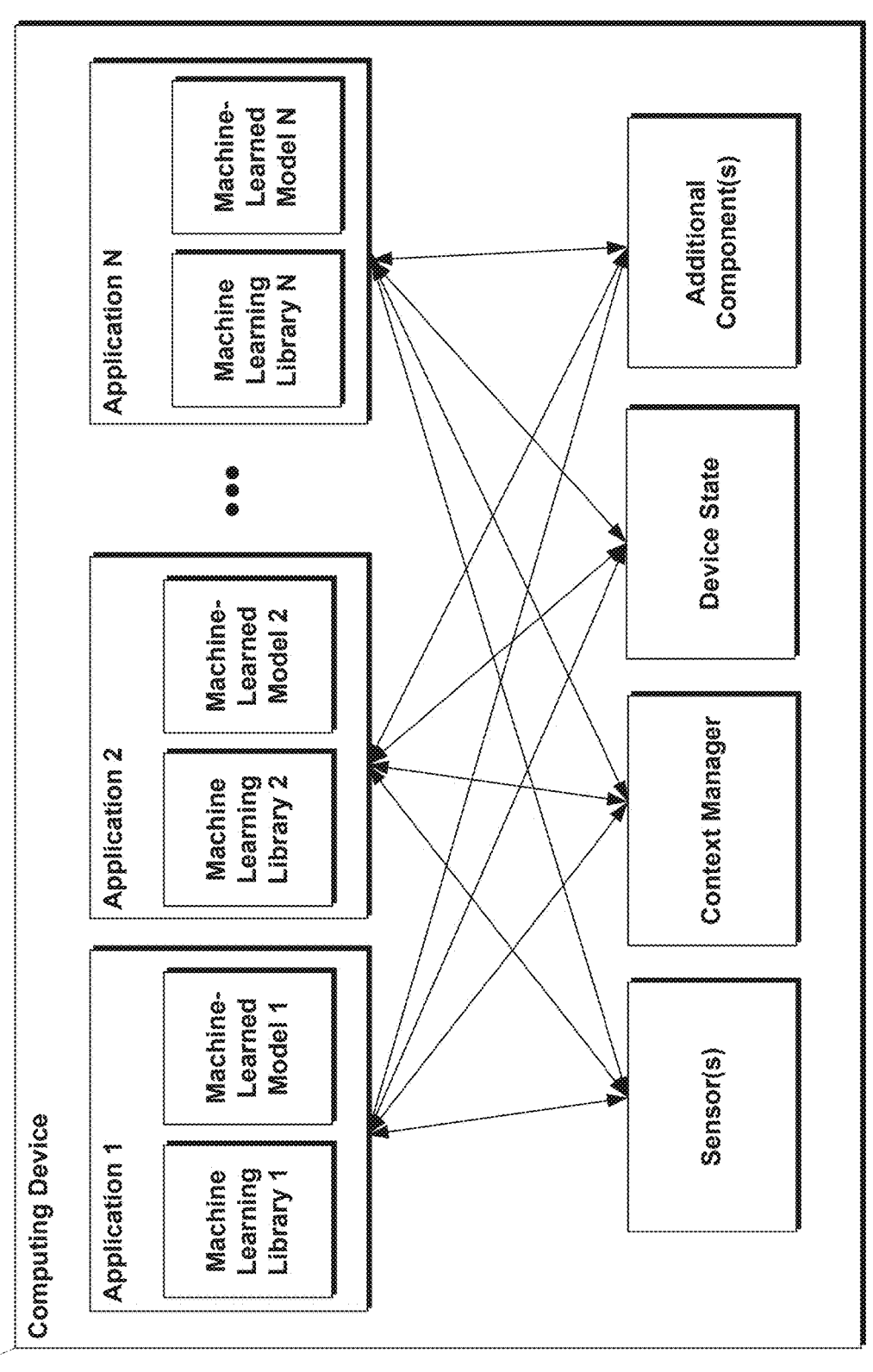
FIG. 5B depicts a block diagram of an example computing device that performs learning of a machine-learned parameter value prediction model according to example embodiments of the present disclosure.

FIG. 5B depicts a block diagram of an example computing device 510 that performs learning of a machine-learned parameter value prediction model according to example aspects of the present disclosure. The computing device 510 can be a user computing device or a server computing device.

The computing device 510 includes a number of applications (e.g., applications 1 through N). Each application contains its own machine learning library and machine-learned model(s). For example, each application can include a machine-learned model. Example applications include a text messaging application, an email application, a dictation application, a virtual keyboard application, a browser application, etc.

As illustrated in FIG. 5B, each application can communicate with a number of other components of the computing device, such as, for example, one or more sensors, a context manager, a device state component, and/or additional components. In some implementations, each application can communicate with each device component using an API (e.g., a public API). In some implementations, the API used by each application is specific to that application.

Figure 5C:
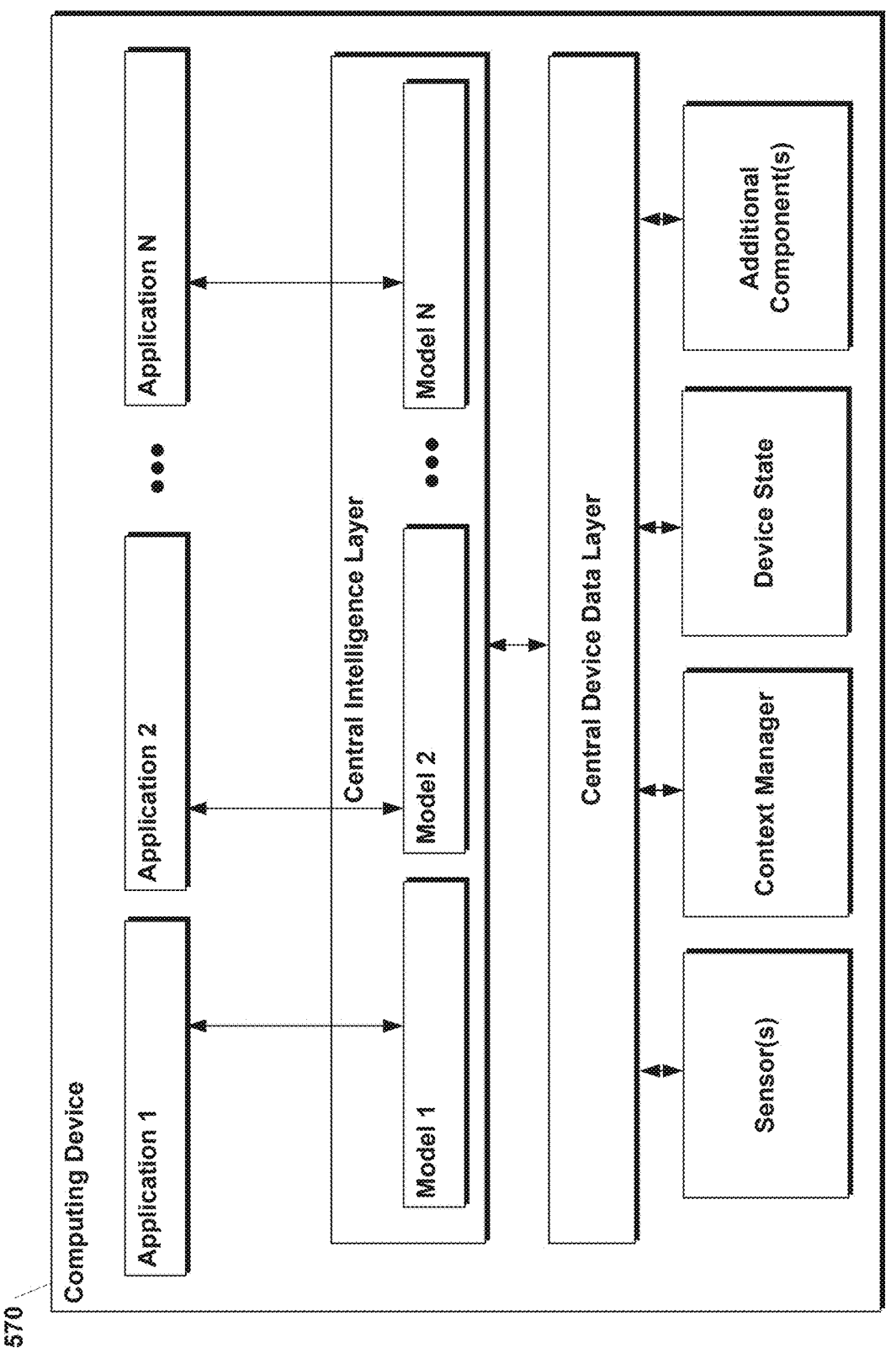
FIG. 5C depicts a block diagram of an example computing device that performs learning of a machine-learned parameter value prediction model according to example embodiments of the present disclosure.

FIG. 5C depicts a block diagram of an example computing device 570 that performs learning of a machine-learned parameter value prediction model according to example aspects of the present disclosure. The computing device 570 can be a user computing device or a server computing device.

The computing device 570 includes a number of applications (e.g., applications 1 through N). Each application is in communication with a central intelligence layer. Example applications include a text messaging application, an email application, a dictation application, a virtual keyboard application, a browser application, etc. In some implementations, each application can communicate with the central intelligence layer (and model(s) stored therein) using an API (e.g., a common API across all applications).

The central intelligence layer includes a number of machine-learned models. For example, as illustrated in FIG. 5C, a respective machine-learned model can be provided for each application and managed by the central intelligence layer. In other implementations, two or more applications can share a single machine-learned model. For example, in some implementations, the central intelligence layer can provide a single model (e.g., a single model) for all of the applications. In some implementations, the central intelligence layer is included within or otherwise implemented by an operating system of the computing device 570.

The central intelligence layer can communicate with a central device data layer. The central device data layer can be a centralized repository of data for the computing device 570. As illustrated in FIG. 5C, the central device data layer can communicate with a number of other components of the computing device, such as, for example, one or more sensors, a context manager, a device state component, and/or additional components. In some implementations, the central device data layer can communicate with each device component using an API (e.g., a private API).

Example Methods

FIG. 6 depicts a flow chart diagram of an example method 600 for training a machine-learned parameter value prediction model according to example aspects of the present disclosure. Although FIG. 6 depicts steps performed in a particular order for purposes of illustration and discussion, the methods of the present disclosure are not limited to the particularly illustrated order or arrangement. The various steps of the method 600 can be omitted, rearranged, combined, and/or adapted in various ways without deviating from the scope of the present disclosure.

At 602, the method 600 can include generating a plurality of perturbations of a machine-learned parameter value prediction model. Each respective perturbation can be generated by perturbing an initialized set of weights of the machine-learned parameter value prediction model. In some implementations, the perturbations can be generated by perturbing the initialized set of weights around a zero mean Gaussian distribution with a variance parameter.

At 604, the method 600 can include inputting into each perturbation of the machine-learned parameter value prediction model a set of experimental data to obtain a respective predicted parameter value set for the physical model. The set of experimental data can be descriptive of a performance of the quantum computing system. In some implementations, the experimental data can be TSSD. Each predicted parameter value set can include one or more predicted parameter values. For example, in some implementations, the predicted parameter value set can include a coupling strength parameter, a TLS frequency parameter, a ramp time parameter, and/or a dephasing rate parameter.

At 606, the method 600 can include generating, using the physical model for each of the predicted parameter value sets, a respective set of predicted data descriptive of a predicted performance of the quantum computing system over a set of experimental inputs. For example, each set of predicted data can be generated by the computing system using the physical model having the respective predicted parameter value set. Each respective set of predicted data can be descriptive of a predicted performance of the quantum computing system. The experimental inputs can be, for example, a range of plateau frequencies and a range of hold times.

At 608, the method 600 can include modifying the initialized set of weights for the machine-learned parameter value prediction model based at least in part on an objective function based on a comparison between the set of experimental data and the corresponding set of predicted data for each respective perturbation. In some implementations, the objective function can be a cost function or a reward function. In some implementations, the objective function for a respective perturbation can be determined based at least in part on an $L_2$ norm of the difference between a set of experiment data and the corresponding set of predicted data for the perturbation.

In some implementations, the initialized set of weights can be modified based at least in part on a weighted average of the perturbations. For example, in some implementations, a respective contribution for each respective perturbation to the weighted average can be a function of the respective cost function.

In some implementations, the initialized set of weights can be modified by adding a multiplication of the weighted average of the perturbations and a learning rate parameter to the initialized set of weights.

In some implementations, following modifying the initialized set of weights for the machine-learned parameter value prediction model, the method can include characterizing TLS-induced errors for a quantum gate based on the physical model and determining a set of gate control values to reduce occurrence of the TLS-induced errors during operation of the quantum gate. For example, a gate control value determination system can receive the predicted data and can determine control values for the quantum gate. The control value determination system can, in some implementations, be implemented using classical processors (e.g., processors 404 of FIG. 4). The control value determination system can select control values that reduce TLS-induced error in the operation of the quantum gate. For example, the predicted data from the physical model can characterize TLS-induced errors for the quantum gate. The control value determination system can determine the set of gate control values to reduce occurrence of the TLS-induced errors during operation of the quantum gate (e.g., by operating the qubits of the gate at a gate interaction frequency that is unaffected by the TLS defects).

FIG. 7 depicts a flow chart diagram of an example method 700 for training a machine-learned parameter value prediction model according to example aspects of the present disclosure. Although FIG. 7 depicts steps performed in a particular order for purposes of illustration and discussion, the methods of the present disclosure are not limited to the particularly illustrated order or arrangement. The various steps of the method 700 can be omitted, rearranged, combined, and/or adapted in various ways without deviating from the scope of the present disclosure.

At 702, the method 700 can include inputting a set of experimental data into a machine-learned parameter value prediction model. In some examples, the method can include additionally obtaining the set of experimental data. The experimental data can be descriptive of a performance of the quantum computing system. In some implementations, the experimental data can be TSSD.

At 704, the method 700 can include receiving one or more predicted parameter values for physical model as an output of a machine-learned parameter value prediction model. The machine-learned parameter value prediction model can be configured to determine one or more parameter values for a physical model. The physical model can be descriptive of one or more physical characteristics of the quantum computing system.

At 706, the method 700 can include generating a set of predicted data for the quantum computing system over a set of experimental inputs. The set of predicted data can be descriptive of a predicted performance of the quantum computing system. For example, the physical model can have the one or more predicted parameter values, and a set of experimental inputs, such as a range of plateau frequencies and a range of hold times can be input into the physical model.

At 708, the method 700 can include training the machine-learned parameter value prediction model using an objective function. For example, the objective function can be determined based at least in part on a difference between the set of experimental data and the set of predicted data. In some implementations, the machine-learned parameter value prediction model can be trained using an evolutionary algorithm through forward propagation.

In some implementations, following training the machine-learned parameter value prediction model, the method can include characterizing TLS-induced errors for a quantum gate based on a physical model (e.g., a physical gate error model) and determining a set of gate control values to reduce occurrence of the TLS-induced errors during operation of the quantum gate. For example, a gate control value determination system can receive the predicted data and can determine control values for the quantum gate. The control value determination system can, in some implementations, be implemented using classical processors (e.g., processors 404 of FIG. 4). The control value determination system can select control values that reduce TLS-induced errors in the operation of the quantum gate. For example, the predicted data from the physical model can characterize TLS-induced errors for the quantum gate. The control value determination system can determine the set of gate control values to reduce occurrence of the TLS-induced errors during operation of the quantum gate (e.g., by operating the qubits of the gate at a gate interaction frequency that is unaffected by the TLS defects).

Example Measurements

Figure 8:
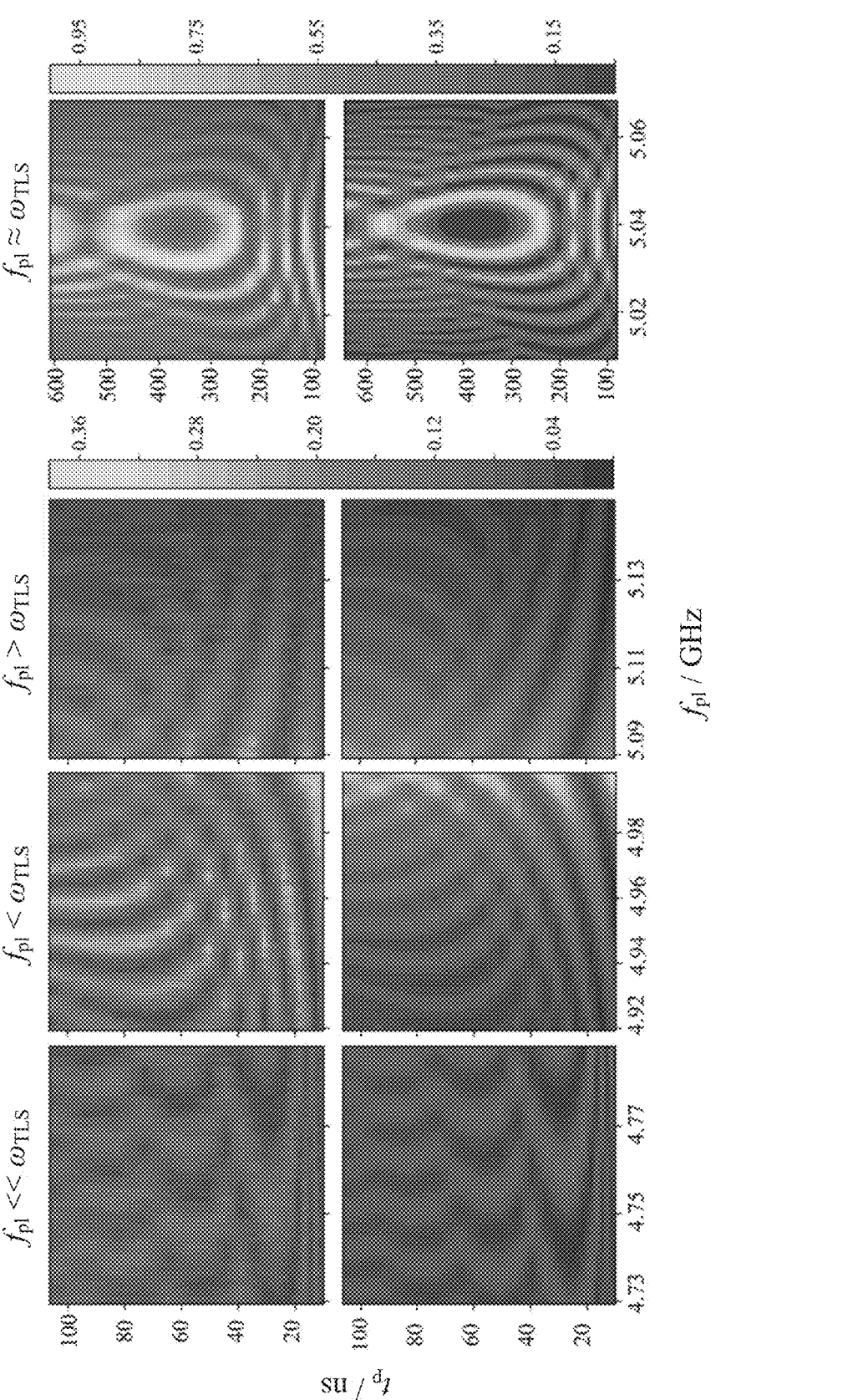
FIG. 8 depicts a set of example predicted data generated by a physical model including a set of parameters produced by a machine-learned parameter value prediction model according to example embodiments of the present disclosure.

FIG. 8 depicts a set of experimentally measured TSSD (top row) and a set of predicted TSSD (bottom row) as predicted according to systems and methods of the present disclosure, where $f_{idle}$=5.6 GHZ, $\lambda$=8.959 MHz, $\omega_{TLS}$=5.04 GHz, $\Gamma_2$=10 MHz, and $t_r$=6 ns. Each column corresponds to one of four different regimes of plateau frequencies, as indicated above each column.

Figure 9:
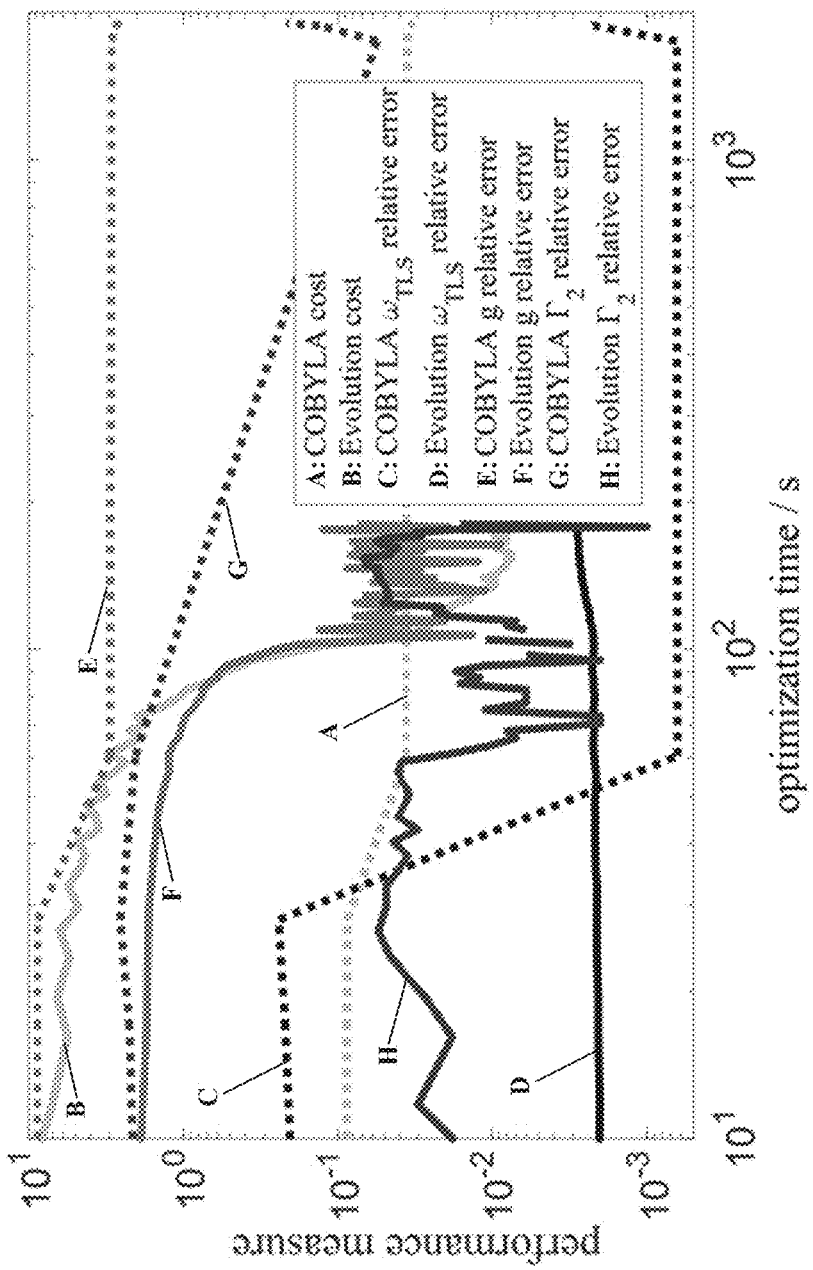
FIG. 9 depicts a set of example performance measurements according to example embodiments of the present disclosure.

FIG. 9 depicts a comparison between different methods for extracting the indicated physical parameters from one example set of TSSD. "Evolution" indicates one example embodiment according to the present disclosure, whereas the "COBYLA" optimizer is included as a reference. The machine-learned models of the present disclosure outperform traditional optimizers and exhaustive search, in both the fitting accuracy and the rate of convergence in the learning. Both exhaustive search and gradient based COBYLA methods can be blind-sighted by false optimal points of the cost function due to experimental noise in the data. The machine-learned models of the present disclosure, in comparison, offer improved resilience against the spurious effects of noise and robustly find globally optimal parameters.

The cost in FIG. 9 is the total $L_2$ error between a set of experimental TSSD and a corresponding set of predicted TSSD. The relative error for each TLS parameter is defined by its difference from the correct value divided by the amplitude of each parameter. In particular, the machine-learned models of the present disclosure can achieve at least one magnitude lower $L_2$ error in predicting the TSSD than traditional COBYLA optimizers with a wall-clock runtime of around 100 s, in this example. In contrast, a grid search on all the parameters takes 1,000,000 s for a common workstation, which we use to perform the optimization, and the relative error for each parameter predicted by example machine-learned models according to aspects of the present disclosure is consistently lower than that of COBYLA.

Figure 10:
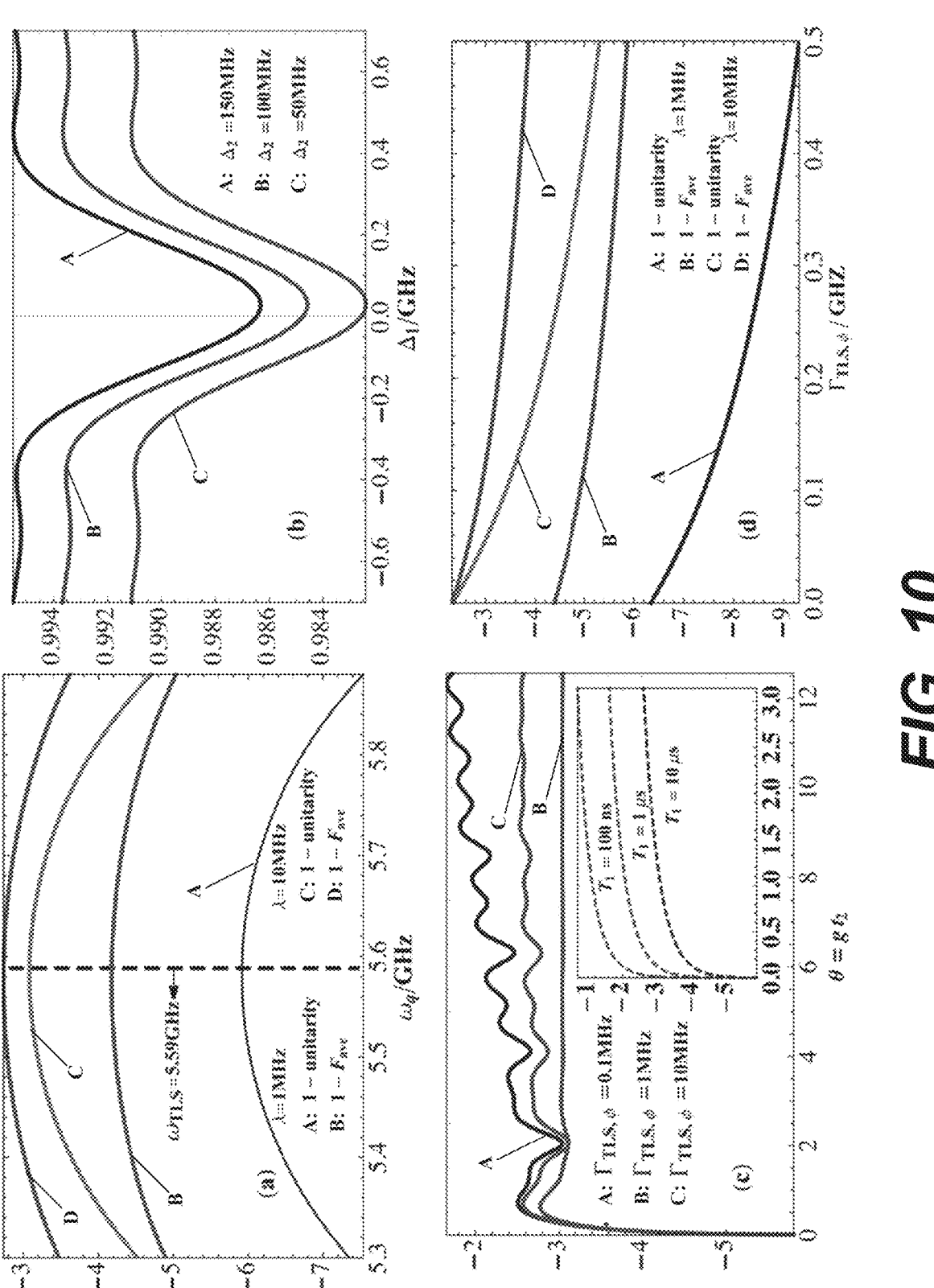
FIG. 10 depicts a set of example two-qubit gate fidelity measures according to example embodiments of the present disclosure.

FIG. 10 depicts example calculations of two-gate fidelity measures as a function of the predicted TLS parameters. In the example depicted, unless otherwise indicated, $\lambda$=10 MHz, g=50 MHz, and $t_2$=$\pi$/(4 g). For (a), (b), and (d), $f_{idle}$=5.7 GHZ, and $t_2$ and $\omega_q$ are chosen to satisfy the condition, $$U_2(g, t_2, \omega_q) = \sqrt{ISWAP},\tag{58}$$

where $$\sqrt{ISWAP} = \frac{1}{\sqrt{2}}\begin{pmatrix} \sqrt{2} & 0 & 0 & 0 \\ 0 & 1 & i & 0 \\ 0 & i & 1 & 0 \\ 0 & 0 & 0 & \sqrt{2} \end{pmatrix}.\tag{59}$$

Subplot (a) depicts a log scale average two-qubit gate error (1−$F_{ave}$) and 1-rescaled unitarity plotted against interaction frequency for different qubit-TLS interaction strengths $\lambda$. Subplot (b) depicts average two-qubit gate fidelity plotted against $\Delta_1$=$\omega_{TLS,1}$−$\omega_q$ (for the first TLS) for different values of $\Delta_2$=$\omega_{TLS,2}$-$\omega_q$ (for the second TLS near the second qubit).

Subplot (c) depicts a log scale average two-qubit gate error plotted against a two-qubit gate rotation angle $\theta$=$gt_2$ under different TLS dephasing rates $\Gamma_{TLS,\phi}$, with an inset plot depicting incoherent error due to qubit relaxation for a chosen range of coherence time.

Subplot (d) depicts average two-qubit gate error (1−$F_{ave}$) and 1−rescaled unitarity plotted against TLS dephasing rate $\Gamma_{TLS,\phi}$ for different qubit-TLS interaction strengths $\lambda$.

ADDITIONAL DISCLOSURE

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, and in digital and/or quantum computer hardware, including the structures disclosed in this specification and their structural equivalents, or in combinations of one or more of them. The term "quantum computational systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, (i.e., a quantum data processing apparatus that is designed to simulate or produce information about a specific quantum system). In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language (e.g., QCL or Quipper).

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry (e.g., an FPGA or an ASIC), or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for operating a quantum computing system comprising:

obtaining, by a computing system comprising one or more classical processors, a set of experimental data descriptive of a performance of the quantum computing system, wherein the experimental data comprises a set of data descriptive of a quantum gate, and wherein the quantum gate is configured to operate on one or more qubits;

predicting, by the computing system using a machine-learned parameter prediction model, a predicted parameter value set based at least in part on the experimental data wherein the predicted parameter value set includes at least one of a coupling strength parameter, a two-level system (TLS) frequency parameter, a ramp time parameter, or a dephasing rate parameter;

obtaining, by the computing system, an output of the physical model that includes the predicted parameter value set;

determining, by the computing system, a comparison of the output of the physical model to the data descriptive of the performance of the quantum computing system;

training, by the computing system, a machine-learned parameter value prediction model using an evolutionary algorithm based at least in part on the comparison and the predicted parameter value set for the physical model, wherein training comprises generating, by the computing system, a plurality of perturbations of the machine-learned parameter value prediction model, each respective perturbation generated by perturbing an initialized set of weights of the machine-learned parameter value prediction model;

characterizing, by the computing system, using the evolutionary algorithm, errors for the quantum gate;

determining, by the computing system, a set of gate control values; and operating the quantum computing system, in accordance with the set of gate control values and the trained one or more predicted parameters of the machine-learned parameter value prediction model such that the errors for the quantum gate are reduced in comparison to the characterized errors for the quantum gate.

2. The method of operating the quantum computing system of claim 1, wherein training, by the computing system, one or more parameters of the machine-learned parameter value prediction model using an evolutionary algorithm further comprises:

inputting, by the computing system into each perturbation of the machine-learned parameter value prediction model, the set of experimental data to obtain a respective predicted parameter value set for the physical model;

generating, by the computing system using the physical model for each of the predicted parameter value sets, a respective set of predicted data descriptive of a predicted performance of the quantum computing system over a set of experimental inputs; and modifying, by the computing system, the initialized set of weights for the machine learned parameter value prediction model based at least in part on an objective function based on a comparison between the set of experimental data and the respective set of predicted data for each respective perturbation.

3. The method of operating the quantum computing system of claim 1, wherein the set of experimental data comprises two-dimensional swap spectroscopy data comprising a probability of a qubit initialized in an excited state to decay to a ground state for a range of plateau frequencies and a range of hold times.

4. The method of operating the quantum computing system of claim 3, wherein the two-dimensional swap spectroscopy data was collected over the range of plateau frequencies with a uniform step size and over the range of hold times with a non-uniform step size.

5. The method of operating the quantum computing system of claim 4, wherein the non-uniform step size comprises a logarithmic step size.

6. The method of operating the quantum computing system of claim 1, wherein the quantum gate comprises a two-qubit quantum gate.

7. The method of operating the quantum computing system of claim 1, wherein the physical model comprises a model of non-Markovian quantum dynamics of interactions between the one or more qubits and one or more two-level-system (TLS) defects during operation of the quantum gate.

8. The method of operating the quantum computing system of claim 1, wherein the dephasing rate parameter comprises a sum of a TLS dephasing rate parameter and a qubit dephasing rate parameter.

9. The method of operating the quantum computing system of claim 1, wherein the set of experimental inputs comprises a set of inputs for a range of plateau frequencies and a range of hold times.

10. The method of operating the quantum computing system of claim 1, wherein the physical model is configured to predict a probability of qubit decay for the one or more qubits based at least in part on an input that describes a plateau frequency and a hold time for the one or more qubits.

11. The method of operating the quantum computing system of claim 1, wherein the plurality of perturbations are randomized.

12. The method of operating the quantum computing system of claim 1, the training further comprising, generating by the computing system, the plurality of perturbations by perturbing the initialization set of weights around a zero mean Gaussian distribution with a variance parameter.

13. A computing system, comprising:
one or more processors; and
one or more non-transitory computer-readable media that collectively store instructions that, when executed by the one or more processors cause the one or more processors to perform operations, the operations comprising:
obtaining a set of experimental data associated with a quantum computing system, the experimental data descriptive of a performance of the quantum computing system, wherein the experimental data comprises a set of data descriptive of a quantum gate, and wherein the quantum gate is configured to operate on one or more qubits;
inputting the set of experimental data into a machine-learned parameter value prediction model configured to determine one or more parameter values for a physical model descriptive of one or more physical character-istics of the quantum computing system;
receiving, as an output from the machine-learned parameter value prediction model, one or more predicted parameter values for the physical model wherein the one or more predicted parameter values are predicted based at least in part on the set of experimental data, wherein a predicted parameter value set for the physical model includes at least one of a coupling strength parameter, a two-level system (TLS) frequency param-eter, a ramp time parameter, or a dephasing rate param-eter;
generating, using the physical model having the one or more predicted parameter values for the physical model, a set of predicted data for the quantum com-puting system over a set of experimental inputs, the set of predicted data descriptive of a predicted perfor-mance of the quantum computing system;
training the machine-learned parameter value prediction model using an objective function, the objective func-tion determined based at least in part on a difference between the set of experimental data and the set of predicted data and the predicted parameter value set for the physical model, wherein training comprises gener-ating, a plurality of perturbations of the machine-learned parameter value prediction model, each respec-tive perturbation generated by perturbing an initialized set of weights of the machine-learned parameter value prediction model;
generating, using machine-learned value prediction model, a second set of predicted data for the quantum computing system over a set of experimental inputs;
characterizing errors for the quantum gate using the objective function;
determining a set of gate control values; and
operating the quantum computing system, in accordance with the set of gate control values and the trained one or more predicted parameters of the machine-learned parameter value prediction model such that the errors for the quantum gate are reduced in comparison to the characterized errors for the quantum gate.

14. The computing system of claim 13, wherein training the machine-learned parameter value prediction model using an objective function comprises training the machine-learned parameter value prediction model using an evolu-tionary algorithm through forward propagation.

15. The computing system of claim 13, wherein the physical model comprises a model of non-Markovian quan-tum dynamics of interactions between one or more qubits and one or more two-level-system (TLS) defects during operation of the quantum gate.

16. The computing system of claim 15, wherein the quantum gate comprises a two qubit quantum gate.

17. The computing system of claim 15, wherein the set of experimental data comprises two-dimensional swap spec-troscopy data comprising a probability of a qubit initialized in an excited state to decay to a ground state or a range of plateau frequencies and a range of hold times.

18. One or more non-transitory computer-readable media that collectively store instructions that, when executed by one or more processors, cause the one or more processors to perform operations, the operations comprising:
receiving a set of experimental data descriptive of a performance of a quantum computing system, the experimental data indicating a probability of a qubit decaying to a ground state after exciting the qubit to an excited state;
inputting the set of experimental data into a machine-learned parameter value prediction model;
obtaining a predicted parameter value set for a physical model wherein the one or more predicted parameter values are based at least in part on the set of experi-mental data, the physical model being descriptive of one or more physical characteristics of the quantum computing system;
generating a set of predicted data over a set of experi-mental inputs, wherein the set of predicted data is generated by using the physical model having the predicted parameter value set and describes a predicted performance of the quantum computing system, wherein a predicted parameter value set for the physical model includes at least one of a coupling strength parameter, a two-level system (TLS) frequency parameter, a ramp time parameter, or a dephasing rate parameter;

training the machine-learned parameter value prediction model using an objective function, the objective function determined based at least in part on a difference between the set of experimental data and the set of predicted data, wherein training comprises generating, a plurality of perturbations of the machine-learned parameter value prediction model, each respective perturbation generated by perturbing an initialized set of weights of the machine-learned parameter value prediction model;

characterizing errors for a quantum gate using the objective function;

modifying the machine-learned parameter value prediction model based at least in part on a difference between the set of experimental data and the set of predicted data; and operating the quantum computing system, in accordance with the set of gate control values and the trained one or more parameters of the machine-learned parameter value prediction model such that the errors for the quantum gate are reduced in comparison to the characterized errors for the quantum gate.

19. The one or more non-transitory computer-readable media of claim 18, wherein the plurality of perturbations are randomized.

\* \* \* \* \*